US012066467B2

(12) United States Patent
Brown et al.

(10) Patent No.: US 12,066,467 B2
(45) Date of Patent: Aug. 20, 2024

(54) EWOD DEVICE WITH SENSING APPARATUS

(71) Applicant: Sharp Life Science (EU) Limited, Uxbridge (GB)

(72) Inventors: Christopher James Brown, Uxbridge (GB); Benjamin James Hadwen, Uxbridge (GB)

(73) Assignee: Sharp Life Science (EU) Limited, Uxbridge (GB)

(*) Notice: Subject to any disclaimer, the term of this patent is extended or adjusted under 35 U.S.C. 154(b) by 0 days.

(21) Appl. No.: 17/767,640

(22) PCT Filed: Oct. 22, 2020

(86) PCT No.: PCT/EP2020/079799
§ 371 (c)(1),
(2) Date: Apr. 8, 2022

(87) PCT Pub. No.: WO2021/094071
PCT Pub. Date: May 20, 2021

(65) Prior Publication Data
US 2024/0103047 A1    Mar. 28, 2024

(30) Foreign Application Priority Data
Oct. 25, 2019 (EP) ..................... 19205486

(51) Int. Cl.
*G01R 19/10* (2006.01)
*B01L 3/00* (2006.01)

(52) U.S. Cl.
CPC ........ *G01R 19/10* (2013.01); *B01L 3/502792* (2013.01); *B01L 2300/0645* (2013.01);
(Continued)

(58) Field of Classification Search
CPC .............. G01R 19/10; B01L 3/502792; B01L 2300/0645; B01L 2300/0663; B01L 2300/161; B01L 2400/0427
See application file for complete search history.

(56) References Cited

U.S. PATENT DOCUMENTS 10,444,151 B2 * 10/2019 Barcelo ................. G01N 21/658
2009/0039415 A1 *  2/2009 Choi .................... H01L 21/0228
427/96.8
(Continued)

FOREIGN PATENT DOCUMENTS

GB          2569630 A     6/2019

OTHER PUBLICATIONS

International Search Report for related International Application No. PCT/EP2020/079799 mailed Dec. 22, 2020.

*Primary Examiner* — Jermele M Hollington
*Assistant Examiner* — Zannatul Ferdous
(74) *Attorney, Agent, or Firm* — Renner, Otto, Boisselle & Sklar, LLP

(57) ABSTRACT

An electro-wetting on dielectric (EWOD) device, comprises first and second substrates defining a fluid chamber therebetween, a plurality of electro-wetting electrodes on the first substrate, and at least one first electrode and at least two second electrodes on the second substrate. The device further includes a current sensor for sensing a difference between (1) a first current flowing between the first electrode and one of the second electrodes via a first fluid package in the fluid chamber of the EWOD device and (2) a second current flowing between the first electrode and another of the second electrodes via a second fluid package in the fluid chamber of the EWOD device.

20 Claims, 20 Drawing Sheets

(52) U.S. Cl.
CPC . *B01L 2300/0663* (2013.01); *B01L 2300/161* (2013.01); *B01L 2400/0427* (2013.01)

(56) References Cited

U.S. PATENT DOCUMENTS

| | | | |
|---|---|---|---|
| 2009/0046082 A1* | 2/2009 | Jacobson | G02B 26/005 345/204 |
| 2019/0111433 A1 | 4/2019 | French | |
| 2021/0239688 A1* | 8/2021 | Chang | A61B 5/685 |

\* cited by examiner

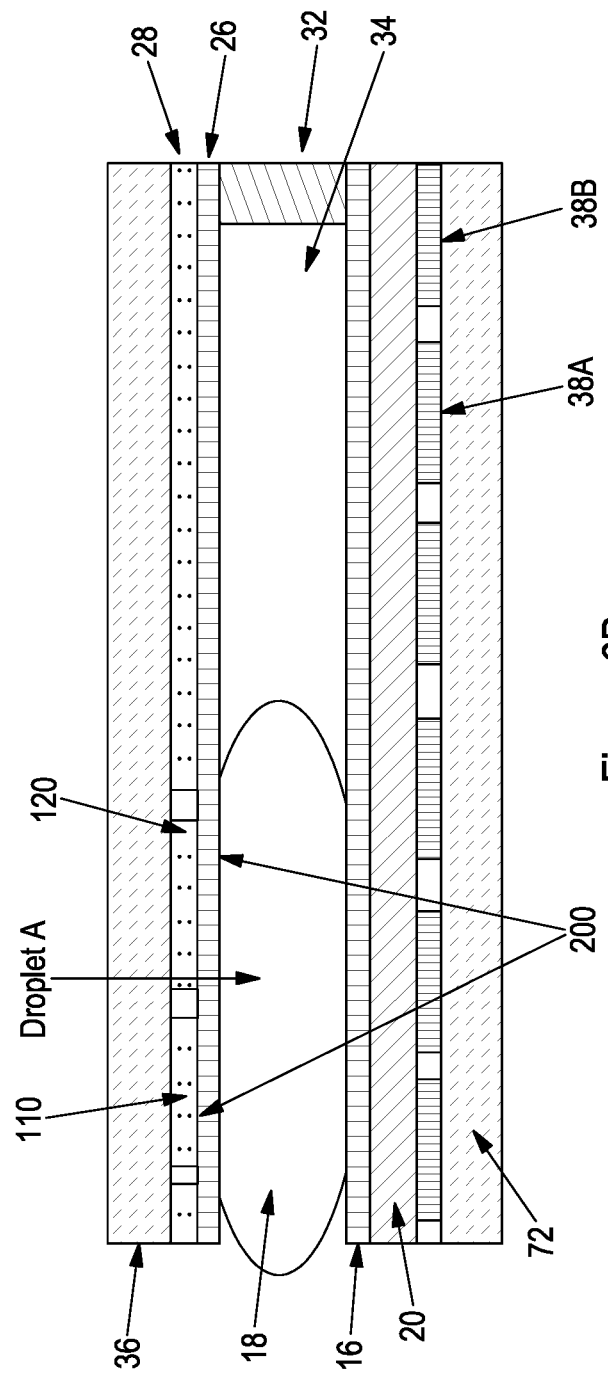

EWOD DEVICE WITH SENSING APPARATUS

This application is a national phase of International Application No. PCT/EP2020/079799 filed 22 Oct. 2020, which claims priority to European Patent Application No. 19205486.4 filed 25 Oct. 2019, the entire disclosures of which are hereby incorporated by reference.

TECHNICAL FIELD

The present invention relates to a microfluidic device, and to a method of manipulating fluid droplets in such a device. More particularly, the invention relates to an Electro-wetting on Dielectric (EWOD) microfluidic device such as, for example, an Active Matrix Electro-wetting on Dielectric (AM-EWOD) microfluidic device. Electro-wetting-On-Dielectric (EWOD) is a known technique for manipulating droplets of fluid on an array. Active Matrix EWOD (AM-EWOD) refers to implementation of EWOD in an active matrix array incorporating transistors, for example by using thin film transistors (TFTs).

BACKGROUND ART

Microfluidics is a rapidly expanding field concerned with the manipulation and precise control of fluids on a small scale, often dealing with sub-microlitre volumes. There is growing interest in its application to chemical or biochemical assays and synthesis, both in research and production, and applied to healthcare diagnostics ("lab-on-a-chip"). In the latter case, the small nature of such devices allows rapid testing at point of need using much smaller clinical sample volumes than for traditional lab-based testing.

A microfluidic device has one or more channels (or more generally gaps) with at least one dimension less than 1 millimeter (mm). Common fluids used in microfluidic devices include whole blood samples, bacterial cell suspensions, protein or antibody solutions and various buffers. Microfluidic devices can be used to obtain a variety of interesting measurements including molecular diffusion coefficients, fluid viscosity, pH, chemical binding coefficients and enzyme reaction kinetics. Other applications for microfluidic devices include capillary electrophoresis, isoelectric focusing, immunoassays, enzymatic assays, flow cytometry, sample injection of proteins for analysis via mass spectrometry, PCR amplification, DNA analysis, cell manipulation, cell separation, cell patterning and chemical gradient formation. Many of these applications have utility for clinical diagnostics.

Many techniques are known for the manipulation of fluids on the sub-millimeter scale, characterised principally by laminar flow and dominance of surface forces over bulk forces. Most fall into the category of continuous flow systems, often employing cumbersome external pipework and pumps. Systems employing discrete droplets instead have the advantage of greater flexibility of function.

Electro-wetting on dielectric (EWOD) is a well-known technique for manipulating discrete droplets of fluid by application of an electric field. It is thus a candidate technology for microfluidics for lab-on-a-chip technology. An introduction to the basic principles of the technology can be found in "Digital microfluidics: is a true lab-on-a-chip possible?" (R. B. Fair, Microfluid Nanofluid (2007) 3:245-281).

FIG. 1 shows a part of a conventional EWOD device in cross section. The device includes a lower substrate 72, on which is provided a conductive material which is patterned so that a plurality of array element electrodes 38 (e.g., 38A and 38B in FIG. 1) are realized. The electrode of a given array element may be termed the element electrode 38. The liquid droplet 4, including a polar material (which is commonly also aqueous and/or ionic), is constrained in a plane between the lower substrate 72 and a top substrate 36. A suitable gap between the two substrates may realize a fluid chamber between the two substrates, created, for example, by means of a spacer 32. A non-polar fluid 34 (e.g. oil) may be used to occupy that part of the volume of the fluid chamber not occupied by the liquid droplet 4. An insulator layer 20 disposed upon the lower substrate 72 separates the conductive element electrodes 38A, 38B from a first hydrophobic coating 16 upon which the liquid droplet 4 sits with a contact angle 6 represented by θ. The hydrophobic coating is formed from a hydrophobic material (commonly, but not necessarily, a fluoropolymer).

On the top substrate 36 is a second hydrophobic coating 26 with which the liquid droplet 4 may come into contact. Interposed between the top substrate 36 and the second hydrophobic coating 26 is a reference electrode 28.

The droplets have a contact angle 6 with the hydrophobic surface of the insulator layer. The contact angle 6 is determined by the balancing of the surface tension components (1) from the hydrophobic coating 16 to the liquid of the droplets 4 (γSL) interface, (2) from the liquid of the droplets 4 to the surrounding fluid medium 34 (γLG) interface, and (3) from the hydrophobic coating 16 to the surrounding fluid medium 34 (γSG) interface. Where no voltages are applied, the contact angle 6 satisfies Young's law, and is of size θ given by the equation:

$$\cos\theta = ((\gamma SG - \gamma SL)/\gamma LG) \quad \text{(Equation 1).}$$

In operation, voltages termed the EW drive voltages, (e.g. $V_T$, $V_0$ and $V_{00}$ in FIG. 1) may be externally applied to different electrodes (e.g. reference electrode 28, element electrodes 38, 38A and 38B, respectively). The resulting electrical forces that are set up effectively control the hydrophobicity of the hydrophobic coating 16. By arranging for different EW drive voltages (e.g. $V_0$ and $V_{00}$) to be applied to different element electrodes (e.g. 38A and 38B), the liquid droplet 4 may be moved in the lateral plane between the two substrates 72 and 36.

FIG. 2 is a drawing depicting additional details of an exemplary AM-EWOD device in schematic perspective, which may incorporate the layered structures in FIG. 1. The AM-EWOD device has a lower substrate 72 with thin film electronics 74 disposed upon the lower substrate 72, and a reference electrode (not shown, but comparable to reference electrode 28 above) is incorporated into an upper substrate 36 (corresponding to the upper substrate of FIG. 1). (Alternatively the electrode configuration may be reversed from that shown in FIG. 2, with the thin film electronics being incorporated into the upper substrate and the reference electrode being incorporated into the lower substrate.) The thin film electronics 74 are arranged to drive array element electrodes 38—for example the thin film electronic 74 associated with an array element electrode may comprise one or more thin-film transistors (TFTs) that are controlled by an EWOD control unit (not shown). A plurality of array element electrodes 38 are arranged in an electrode or element array 42, having X by Y array elements where X and Y may be any integer. A liquid droplet 4 which may include any polar liquid and which typically may be aqueous, is enclosed between the lower substrate 72 and the upper substrate 36 separated by a spacer 32, although it will be appreciated that multiple liquid droplets 4 can be present.

As described above with respect to the representative EWOD structure, the EWOD channel or gap defined by the two substrates initially is filled with the nonpolar filler fluid 5 (e.g. oil). The liquid droplets 4 including a polar material, i.e., the droplets to be manipulated by operation of the EWOD device, must be inputted from an external "reservoir" of fluid into the EWOD channel or gap. The external reservoir may for example be a pipette or may be a structure 10 incorporated into the plastic housing of the device. As the fluid from the reservoir for the droplets is inputted, filler fluid gets displaced and is removed from the EWOD channel.

Example configurations and operation of EWOD devices 15 are described in the following. U.S. Pat. No. 6,911,132 (Pamula et al., issued Jun. 28, 2005) discloses a two-dimensional EWOD array to control the position and movement of droplets in two dimensions. U.S. Pat. No. 6,565,727 (Shenderov, issued May 20, 2003) further discloses methods 20 for other droplet operations including the splitting and merging of droplets, and the mixing together of droplets of different materials. U.S. Pat. No. 7,163,612 (Sterling et al., issued Jan. 16, 2007) describes how TFT based thin film electronics may be used to control the addressing of voltage 25 pulses to an EWOD array by using circuit arrangements very similar to those employed in AM display technologies.

EWOD devices are useful for miniaturising and automating biochemical/chemical processes through the manipulation of aqueous droplets in an oil matrix; EWOD devices 30 may be used to split, move, merge and mix droplets. Typically, biochemical/chemical workflows involve carrying out a sequence of reactions on biological/chemical samples, with each step involving the merging of one or more droplets containing the reagents necessary for that step 35 with the sample droplet. The process of merging of droplets containing reagents into the sample droplet means that the volume of the sample droplet typically increases as the workflow proceeds, and the reaction droplet's composition becomes the sum of the workflow product(s) and any 40 remaining reactants and by-products.

The EWOD device is typically operated as part of a microfluidic system comprising a control system configured to control actuation voltages applied to the electrode array of the EWOD device (or other microfluidic device) to perform 45 manipulation operations to the fluid droplets. For example, FIG. 3a is a block schematic diagram of a microfluidic system 1. The system comprises an EWOD (or other microfluidic) device 2, in this example an active matrix EWOD (AM-EWOD) device, and a controller unit 3. The controller 50 unit 3 comprises electrode control electronics 3a and a processor 3b running appropriate software 3c. A storage device (not shown) may store any application software and any data associated with the system. The electrode control electronics generates, under control of the processor 3b, actuation 55 voltages 5 for applying to element electrodes 38 and a common electrode (not shown) of the microfluidic device 2, for example to effect a pre-determined sequence of droplet operations. FIG. 3a shows the processor 3b as separate from the control electronics 3a and communicating with the 60 control electronics 3a over a datalink 7, but the processor 3b and the control electronics 3a could alternatively be integral with one another. FIG. 3a shows the electrode control electronics 3a as separate from the EWOD device 2 and communicating with the EWOD device via an electrical 65 connector 8, but the control electronics 3a and the EWOD device 2 could alternatively be integral with one another.

The control electronics may include suitable circuitry and/or processing devices that are configured to carry out various control operations relating to control of the EWOD device, such as a CPU, microcontroller or microprocessor.

The control electronics 3a may further receive data signals 9 from one or more sensors (not shown) of the EWOD device 2. The sensor data signals 9 may include signals obtained by operating the EWOD array elements in a sensing mode, and/or may include signals obtained by one or more sensors external to the EWOD array elements such as some or all of illumination and/or detection optics, a thermal control unit or magnetic systems for interacting with the droplets 4.

There are several known methods of measuring the electrical properties of droplets in an EWOD device. Schetrzer (Sensors and Actuators B 145 (2010) 340-347) describes how (complex) impedance measurement through the bottom substrate electrodes can determine droplet conductivity. US20140194305 (Kayyem, Genmark) also describes an electrowetting device with detection electrodes on the bottom substrate to perform electrochemical sensing. U.S. Pat. No. 7,163,612 (Sterling, Keck Grad. Inst.) describes how sensor circuitry may be integrated onto the top substrate. WO2019126715 A1 discloses a method of measuring the electrical properties of an interface between two droplets.

SUMMARY

A first aspect of the present invention provides an electro-wetting on dielectric (EWOD) device, comprising: first and second substrates defining a fluid chamber therebetween; a plurality of electro-wetting electrodes on the first substrate; at least one first electrode and at least two second electrodes on the second substrate; and a current sensor for sensing a difference between (1) a first current flowing between the first electrode and one of the second electrodes via a first fluid package in the fluid chamber of the EWOD device and (2) a second current flowing between the first electrode and another of the second electrodes via a second fluid package in the fluid chamber of the EWOD device.

The current sensor may be a differential current sensor receiving as inputs the first current and the second current.

The device may further comprise at least one third electrode on the second substrate.

The first fluid package may be a fluid droplet in electrical contact with the first electrode and the one of the second electrodes The droplet may be in electrical contact with the third electrode.

Alternatively, the first fluid package may comprise first and second fluid droplets with a droplet interface bilayer therebetween, the first droplet being in electrical contact with the first electrode and the second droplet being in electrical contact with one second electrode The first electrode may extend in a first direction and the one of the second electrodes and the another of the second electrodes may extend substantially parallel to one another, and may extend in a second direction that is crossed with, for example is perpendicular to, the first direction.

The first electrode and the second electrodes may be defined in a common conductive layer.

A guard electrode may be provided between the first electrode and the second electrodes. The guard electrode may be defined in the common conductive layer.

A plurality of first electrodes may be provided on the second substrate, the first electrodes extending substantially parallel to one another in a first direction; and the second electrodes may extend substantially parallel to one another, and extend in a second direction crossed with the first direction.

The first electrodes may be defined in a first conductive layer and the second electrodes may be defined in a second conductive layer.

A hydrophobic coating may be provided over the electrodes on the second substrate, and apertures may be provided in the hydrophobic coating to define regions of electrical contact between the fluid packages and the electrodes.

The diameter of an aperture in the hydrophobic coating may be selected to be small enough not to disrupt the macroscale hydrophobic surface property of the hydrophobic coating.

A second aspect of the present invention provides a method of sensing electrical properties of a fluid package in an electro-wetting on dielectric (EWOD) device, the EWOD device having first and second substrates defining a fluid chamber therebetween, a plurality of electro-wetting electrodes on the first substrate, and at least one bias electrode and at least two sensing electrodes on the second substrate, the method comprising: applying a first bias voltage to a first bias electrode and applying a second bias voltage to a second bias electrode; sensing a first current flowing between the first bias electrode and one of the sensing electrodes via a first fluid package electrically coupled to the first bias electrode and the one of the sensing electrodes; and sensing a second current flowing between the second bias electrode and another of the sensing electrodes via a second fluid package electrically coupled to the second bias electrode and the another of the sensing electrodes. The first bias electrode may be electrically continuous with the second bias electrode to form a common bias electrode, and applying the first bias voltage to the first bias electrode and applying the second bias voltage to the second bias electrode may comprise applying a common bias voltage to the common bias electrode. Alternatively, the first and second bias electrodes may be separate electrodes that are addressable independently of one another.

The first fluid package may comprise at least one reaction constituent; the second fluid package may be a reference fluid package; and the method may further comprise monitoring the progress of a reaction in the first fluid package by comparing variation with time of electrical properties of the first fluid package with variation with time of electrical properties of the second fluid package.

The first fluid package may be a fluid droplet and the second fluid package may be a second fluid droplet.

The first fluid package may comprise first and second fluid droplets having a first droplet interface bilayer therebetween, and the second fluid package may comprise third and fourth fluid droplets having a second droplet interface bilayer therebetween, the first droplet electrically coupled to the first bias electrode, the second droplet electrically coupled to the one of the sensing electrodes, the third droplet electrically coupled to the second bias electrode, and the fourth droplet electrically coupled to the another of the sensing electrodes.

The method may further comprise, before applying the first bias voltage to the first bias electrode and applying the second bias voltage to the second bias electrode: selectively actuating the electro-wetting electrodes to move a first fluid package in the fluid chamber of the EWOD device to be electrically coupled to a first bias electrode and one of the sensing electrodes; and selectively actuating the electro-wetting electrodes to move a second fluid package in the fluid chamber of the EWOD device to be adjacent a second bias electrode and another of the sensing electrodes.

Preferred embodiments of the present invention will now be described by way of illustrative examples with reference to the accompanying figures, in which:

FIG. 6b represents a cross sectional view through an exemplary EWOD device depicting relationship between a single droplet within chamber and respective electrodes without a patterned hydrophobic coating.

Figure 13A:
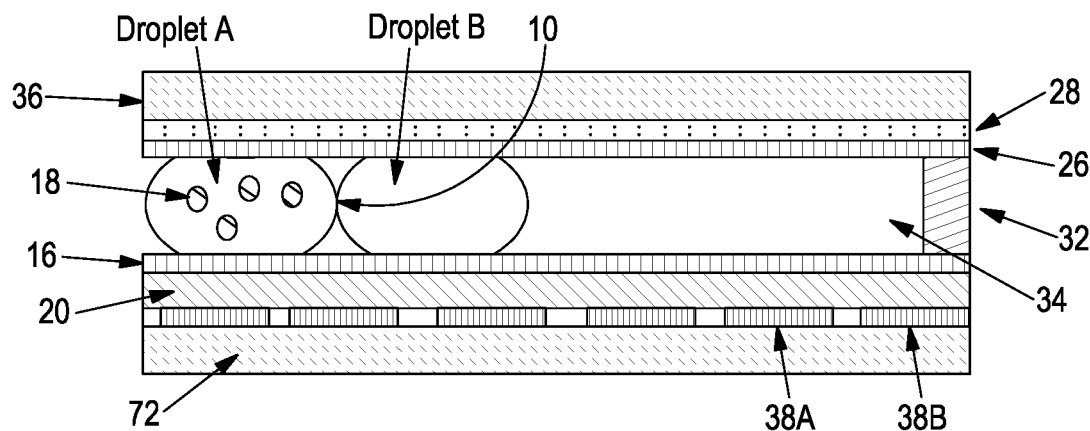
Figure 13B:
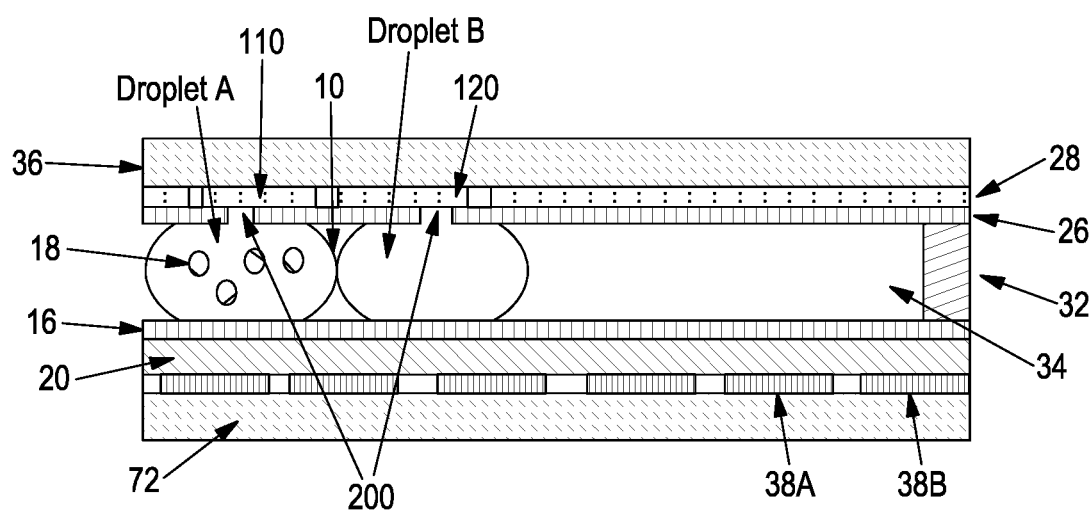

FIG. 13a-b represent cross sectional views through an exemplary EWOD device depicting relationship between droplets within chamber and respective electrodes.

DETAILED DESCRIPTION OF EMBODIMENTS

Figure 3A:
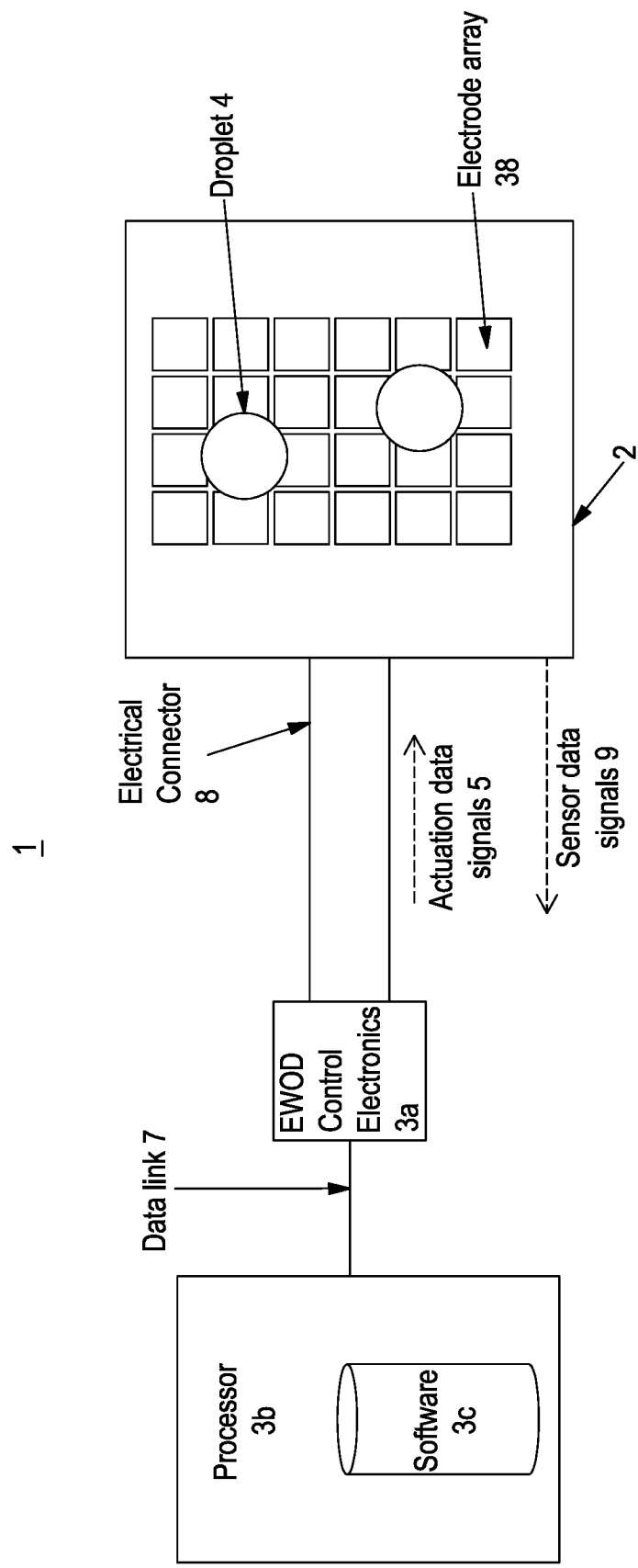
FIG. 3a is a schematic view of an EWOD system.
Figure 3B:
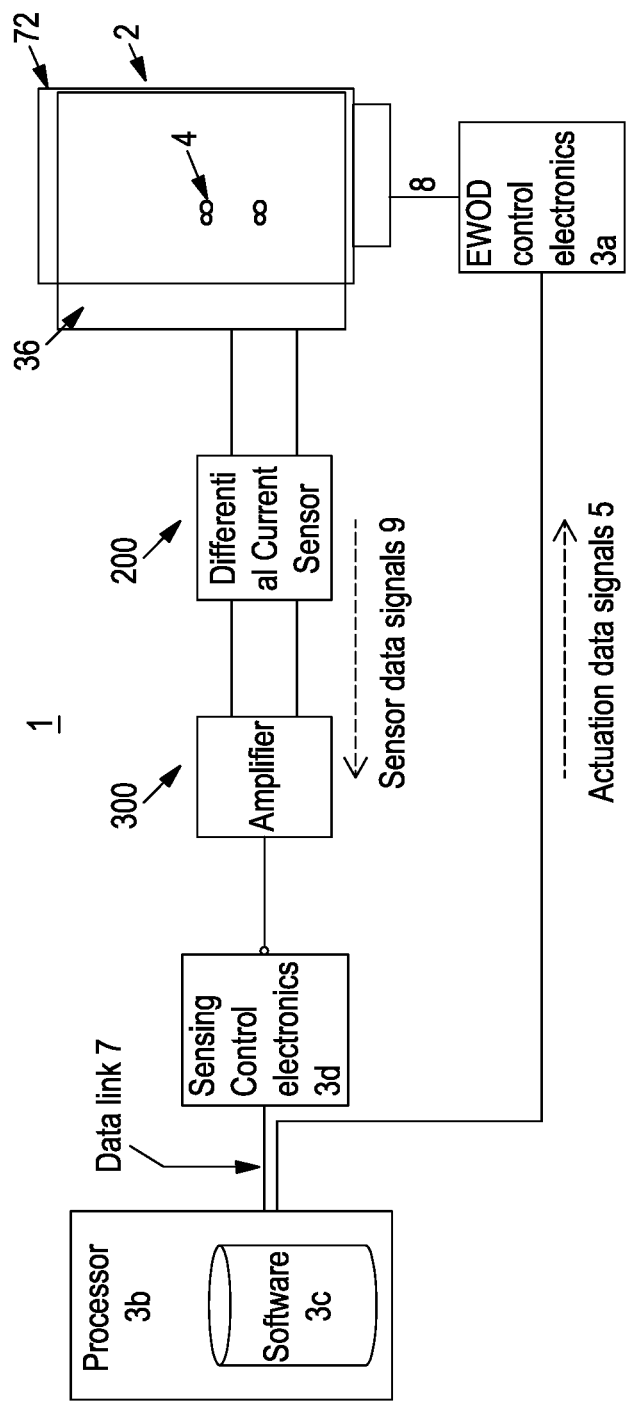
FIG. 3b is a schematic view of an EWOD system with improved sensing electronics.

FIG. 3b is a a block schematic diagram of a microfluidic system 1 having an improved sensor circuit. The system comprises an EWOD (or other microfluidic) device 2, in this example an active matrix EWOD (AM-EWOD) device, and a controller unit 3. The controller unit comprises EWOD control electronics 3a and a processor 3b running appropriate software 3c. A storage device (not shown) may store any application software and any data associated with the system. The EWOD control electronics generates, under control of the processor 3b, actuation voltages 5 for applying to element electrodes 38 (not shown) on lower substrate 36 and a common electrode (not shown) on top substrate 72 of the microfluidic device 2, for example to effect a pre-determined sequence of droplet operations. FIG. 3b shows the processor 3b as separate from the control electronics 3a, 3d and communicating with the control electronics 3a, 3d over a datalink 7, but the processor 3b and the control electronics 3a could alternatively be integral with one another. FIG. 3b also shows the EWOD control electronics 3a as separate from the EWOD device 2 and communicating with the EWOD device via an electrical connector 8, but the EWOD control electronics 3a and the EWOD device 2 could alternatively be integral with one another. The control electronics may include suitable circuitry and/or processing devices that are configured to carry out various control operations relating to control of the EWOD device, such as a CPU, microcontroller or microprocessor.

The sensing control electronics 3d receive sensor data signals 9 from one or more sensors (not shown) of the EWOD device 2. The sensor data signals 9 may include signals obtained by operating the EWOD array elements in a sensing mode, and/or may include signals obtained by one or more sensors external to the EWOD array elements such as some or all of illumination and/or detection optics, a thermal control unit or magnetic systems for interacting with the droplets 4. The sensor output of EWOD 2 is initially received by differential current sensor 200, which is configured to reduce the effects of any interfering signals that might be transmitted from the EWOD device 2. The sensor output is subsequently processed by voltage amplifier 300, to yield data signal 9, which pass via sensing control electronics 3d back to the processor 3b, which is configured to display the results on a user interface and store the results in a storage device (not shown).

Figure 1:
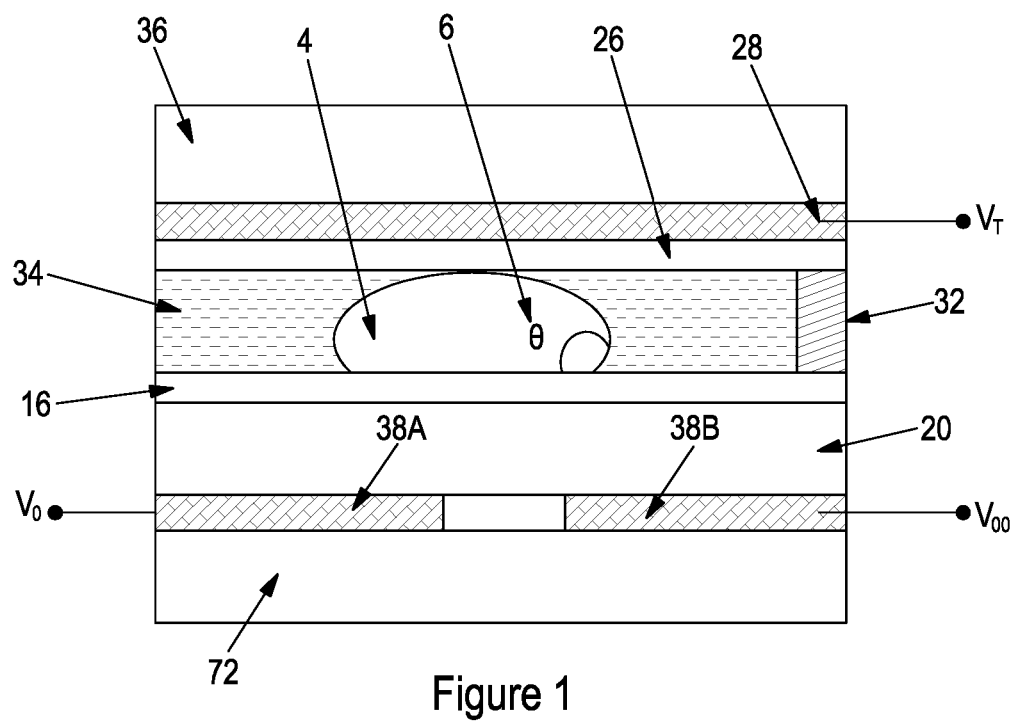
FIG. 1 is a schematic cross-sectional view of an EWOD device.
Figure 2:
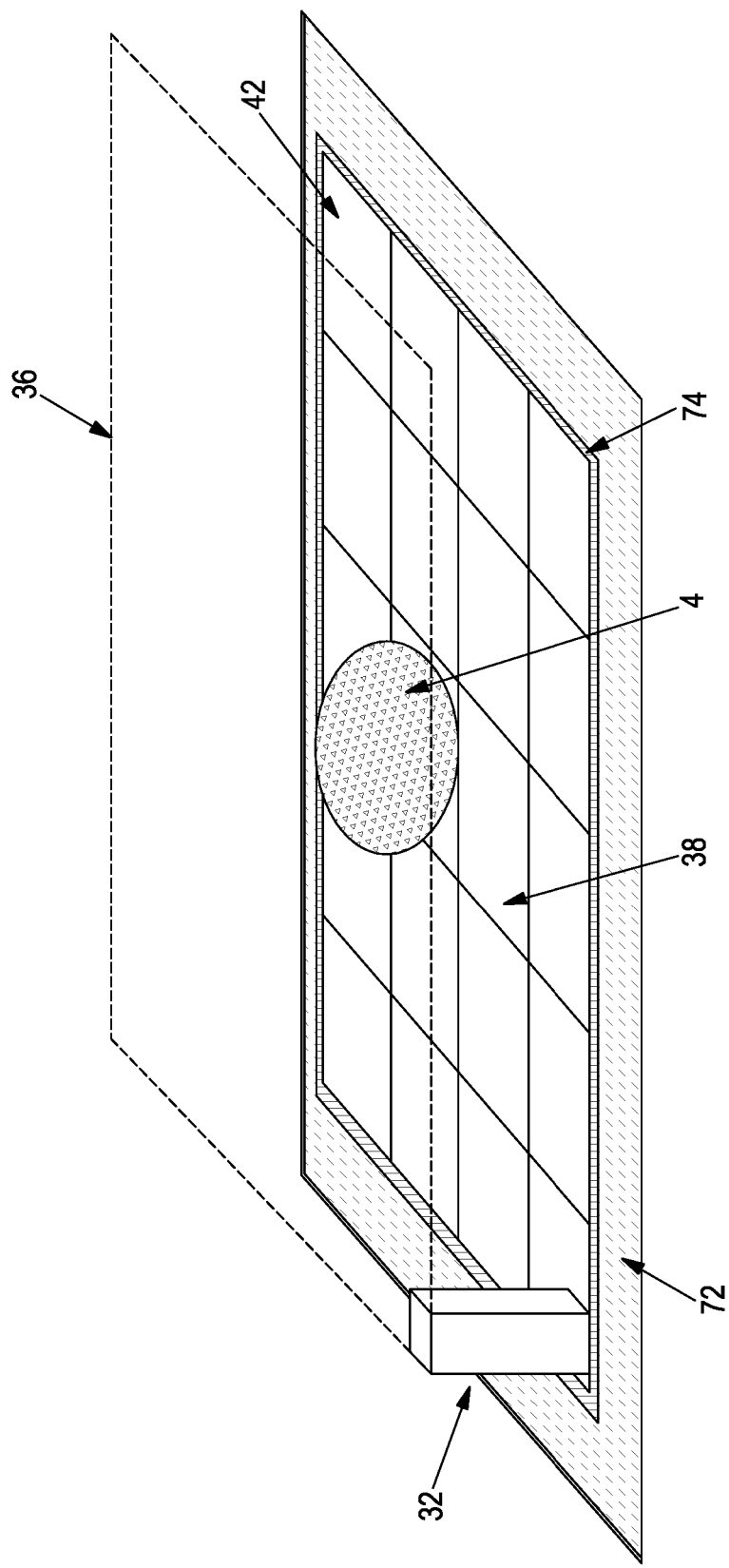
FIG. 2 is a schematic perspective view of an EWOD device.
Figure 4A:
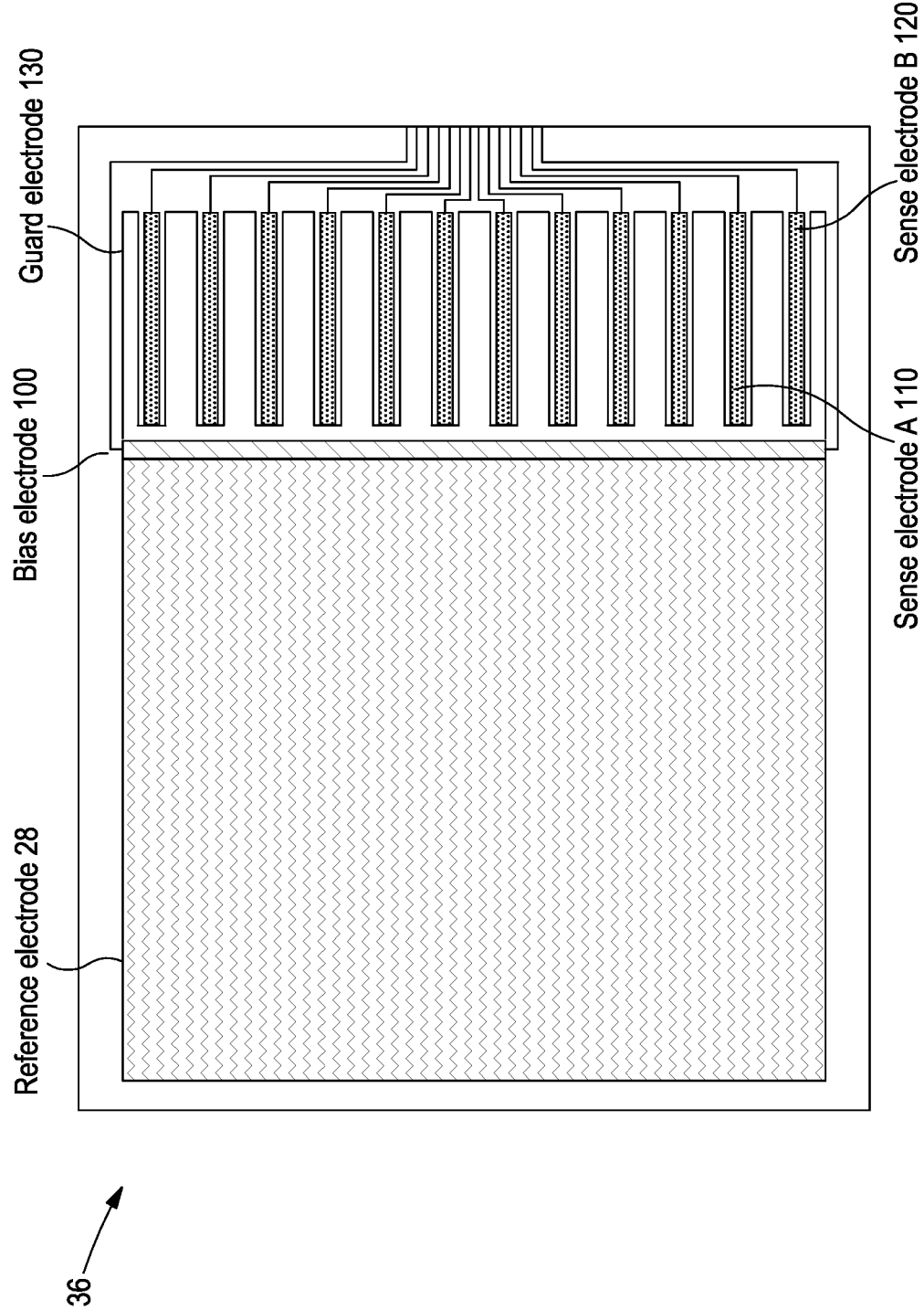
FIG. 4a is a plan view of an exemplary top plate of an EWOD device with integrated sensing electrodes.

FIG. 4a represents a plan view of an exemplary embodiment of an improved top substrate 36 that may be used with the EWOD device of FIG. 1 to achieve high sensitivity measurement of currents associated with droplets, either arranged with DIB interfaces therebetween, or for performing direct electrochemical measurement of a component of the fluid within a droplet, which droplets are being manipulated within the EWOD device. FIG. 4a comprises a reference electrode 28, in common with the device of FIG. 1; however, FIG. 4a further comprises a series of discretely defined electrodes, which may be addressed in common with the reference electrode 28 and so serve as an extension of the reference electrode 28 in one instance, but may alternatively serve as independently addressable electrodes, including bias electrode 100, sense electrode A 110, sense electrode B 120 and guard electrode 130. As will be understood from the description below, a sense electrode A 110 is intended for use with a control droplet or control droplet pair, whereas a sense electrode B 120 is intended for use with a droplet or droplet pair whose characteristic is to be measured or monitored. Whether a sense electrode is a sense electrode A 110 or a sense electrode B 120 is to some extent determined in use, and in principle all the sense electrodes could be identical to one another. In some cases however the optimum geometries of an electrode and/or the wiring connecting to it may differ between a sense electrode A 110 (or "control electrode") and a sense electrode B 120, (for example the sense electrode may be smaller to minimise cross talk to it)—in these cases it may be preferable to designate a sense electrode as either a sense electrode A 110 or a sense electrode B 120 during design/manufacture of the EWOD device and provide the appropriate geometry for the electrode and/or the connecting wiring. The substrate 36 may for example be manufactured by disposing a conductive layer over the entire area (or entire active area) of the substrate, and patterning the conductive layer to form the reference electrode 28 and the further independently addressable electrodes 100, 110, 120, 130. Non-limiting examples of suitable materials for the conductive layer include, but are not limited to Indium Tin Oxide (ITO), Indium Zinc Oxide (IZO), Gold, Silver, Platinum, Aluminium, or poly(3,4-ethylenedioxythiophene) polystyrene sulfonate (PEDOT: PSS).

Within the configuration of FIG. 4a, a sensing channel is defined by sense electrode A 110, sense electrode B 120 and the bias electrode 100. FIG. 4a shows multiple sensing channels, although in principle only one, or any number as may be required, sensing channel(s) need be provided. In the embodiment of FIG. 4a bias electrode 100 is common to all sensing channels, however different sensing channels could have separate bias electrodes if required. Guard electrode 130 is provided to mitigate potential inductance affects that may otherwise compromise the integrity of measurement signals made using respective sense electrodes A 110 and sense electrodes B 120, when paired with bias electrode 100.

During electrowetting manipulation of droplets within the EWOD device, reference electrode 28 and bias electrode 100, sense electrode A 110, sense electrode B 120 and guard electrode 130 may all be biased to act as a single reference electrode 28 against element electrodes 38A and 38B on lower substrate 72 (as depicted in FIG. 1). However, in some aspects of the invention, movement of droplets within the EWOD device, when such droplets are positioned beneath the region of top plate 36 that is patterned with bias electrode 100, sense electrode A 110, sense electrode B 120 and guard electrode 130, may be achieved solely through potentials applied through array element electrodes (38A, 38B), without requiring a path via reference electrode 28.

In an exemplary embodiment of the invention, bias electrode 100, a sense electrode A 110, and a sense electrode B 120 are used to sense a property or characteristic of a droplet, or to monitor a change resulting from transfer of a solute or molecule of interest into or out of the droplet. Measurements may be made between a respective sense electrode A 110 or sense electrode B 120 and the bias electrode 100. As such, sense electrode A 110 or sense electrode B 120 may act as a cathode against bias electrode 100 acting as anode (or vice versa). Thus, in an exemplary embodiment, a droplet may be located to be in electrical contact with bias electrode 100 and sense electrode A 110 or bias electrode 100 and sense electrode B 120 respectively. A voltage may be applied between the bias electrode 100 and the sense electrode A 110 or sense electrode B 120, which results in a current flow through the droplet in contact therewith. The current may be monitored over time to obtain information about a process occurring in the droplet.

Figure 4B:
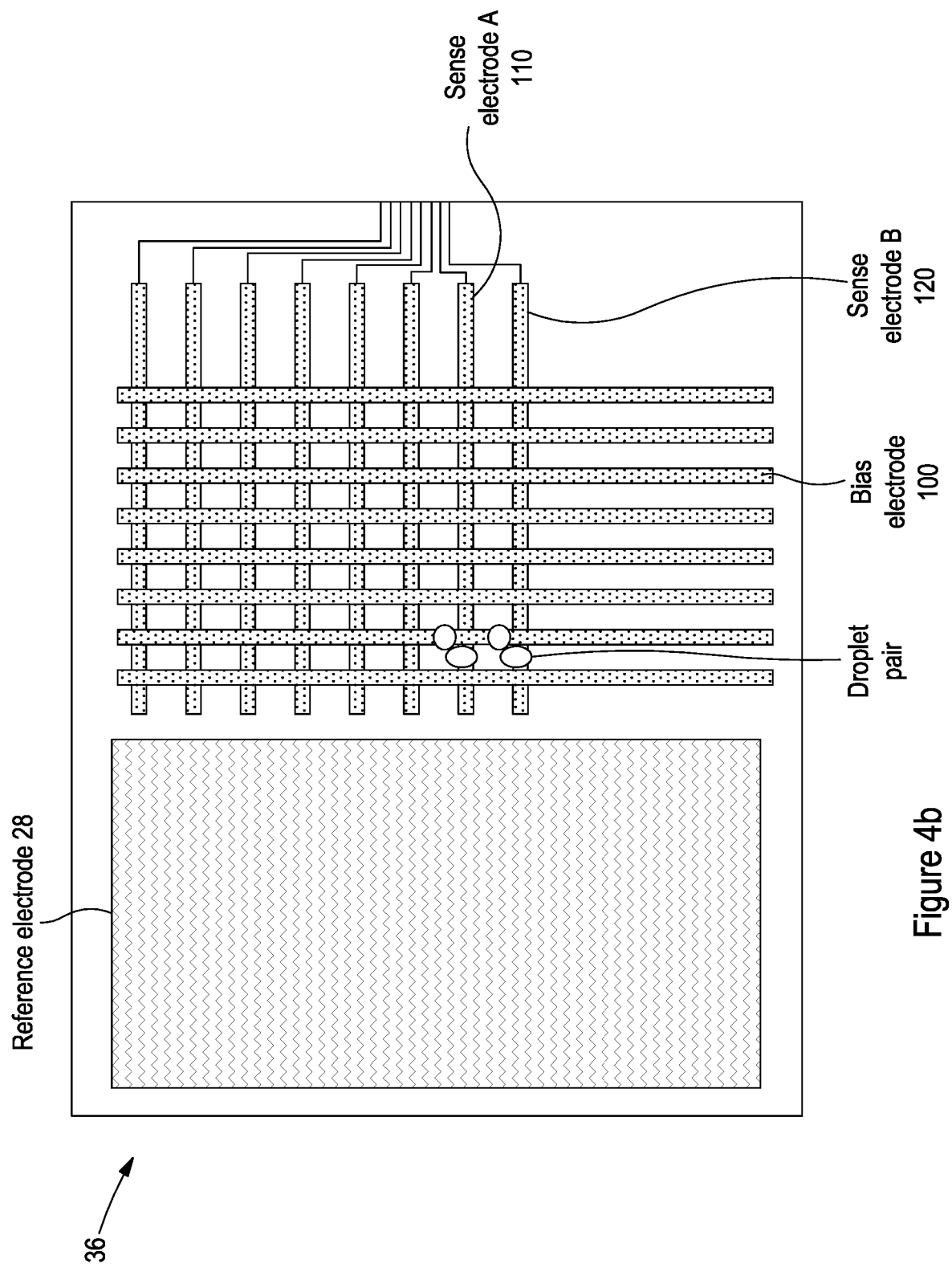
FIG. 4b is a plan view of another exemplary top plate of an EWOD device with integrated sensing electrodes.

FIG. 4b depicts another embodiment of an improved top substrate 36. In this configuration, during the manufacturing process, a first conductive layer is applied to the substrate, which is patterned to define pairs of sense electrodes A and B as horizontal bars. An insulation layer applied over the first conductive layer ensures that the two layers of electrodes are not directly connected at the crossover points. A further conductive layer is applied, which is patterned to define vertical bars that represent bias electrode 100. The insulator layer is then removed in the region of the crossover points to ensure both electrode layers can make direct electrical contact to any droplet brought in contact therewith. Two associated droplet pairs are shown, each connected to a common bias electrode and to different sense electrodes.

Two (or in principle more) droplets may be positioned so as to each contact a respective bias electrode and a respective sense electrodes, and with selective application of a potential to the relevant rows and columns, individual droplets may be monitored at the intersections between respective bias electrodes 100 and sense electrodes 110, 120. The sensing arrangement is then as FIG. 5.

The electrode arrangement of FIG. 4b facilitates a larger number of associated droplet pairs to be sensed than would be the case for the electrode arrangement of FIG. 4a. For the arrangement of FIG. 4a, the total number of electrodes required to sense N droplet pairs scales as ~N+1. In the arrangement of FIG. 4b it scales as ~sqrt(N). Against this, however, the method of construction of the embodiment of FIG. 4b represents a more costly process compared with the embodiment of FIG. 4a, due to the requirements for multiple applied layers.

Figure 4C:
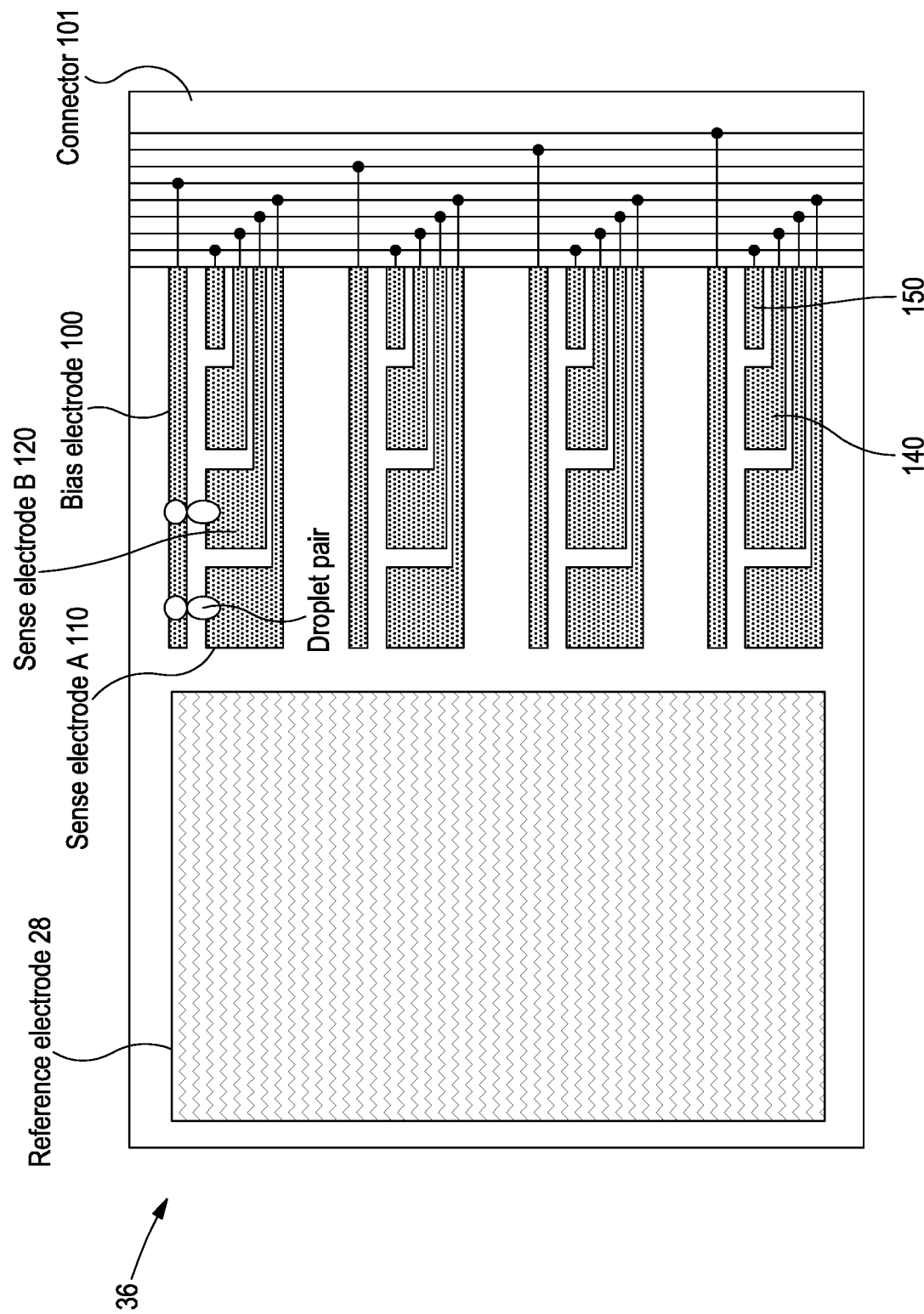
FIG. 4c is a plan view of yet another exemplary top plate of an EWOD device with integrated sensing electrode, showing a connector.

FIG. 4c represents a further embodiment of an improved top substrate 36. In the configuration of FIG. 4c a single conductive layer is applied to the substrate, which conductive layer is pattered to define reference electrode 28 and respective sets of bias electrodes 100 and sense electrodes A 110, B 120, C 140, D 150. Electrical connection is made to the respective bias and sense electrodes using an external connector 101. In the configuration of FIG. 4c (as depicted) measurements may be made simultaneously on respective groups of electrodes A, B, C, D by the selective application of a voltage to each of A, B, C or D and measurement of the associated current sourced (or sunk) through each of A,B,C,D individually. A bias electrode 100 is common to each group of four sense electrodes, but a bias electrode for one group of four sense electrodes A-D does not share a common conductor on connector 101 with a bias electrode for another group of four sense electrodes A-D. Thus, although respective sense electrodes A, for example, share a common conductor on connector 101, because each sense electrode A is associated with a distinct bias electrode 100, distinct circuits are formed for each respective sense electrode, permitting multiple measurements to be made in parallel. Other configurations of electrode groups may be achieved, however adding further sense electrodes would require a more densely packed series of conductors on the connector 101, which may render the device more vulnerable to parasitic capacitance effects.

Figure 9:
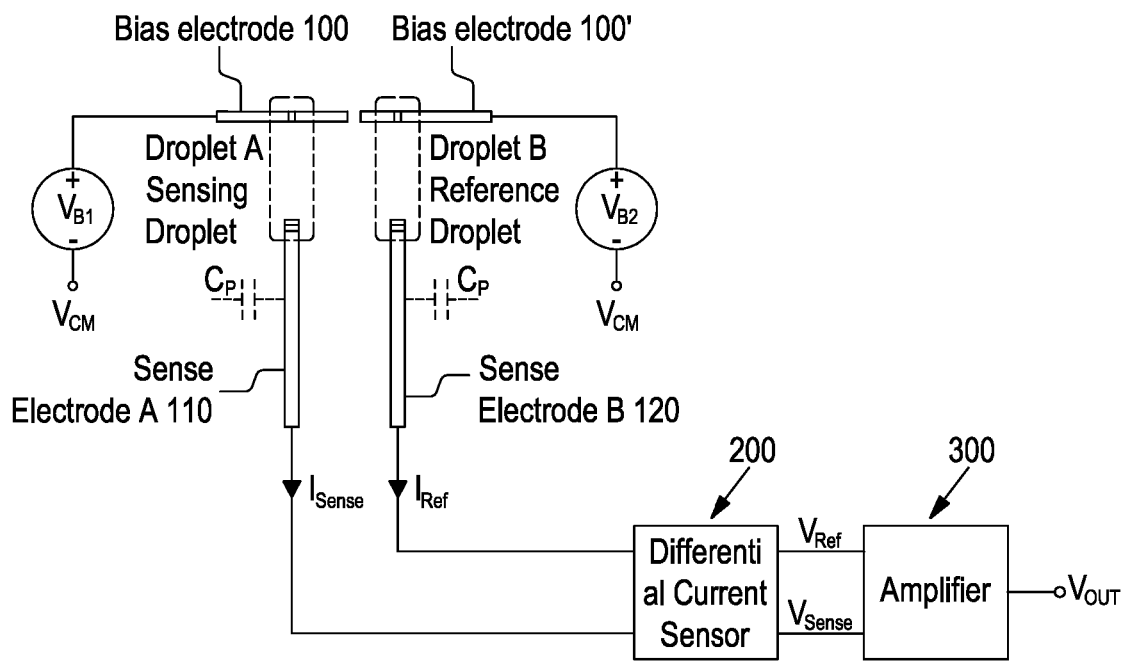
FIG. 9 represents a third embodiment of a sensor configuration with a differential circuit.

When making pair wise measurements using a top plate as patterned according to FIG. 4a, for example, it may be desirable to make comparative measurements using respective sense electrodes A or B that have generally similar conductive path lengths, in order to minimise influences of parasitic capacitance or electromagnetic interference. For example, FIG. 9 shows two droplet pairs, one pair in contact with bias electrode 100 and sense electrode A 110, and the other pair in contact with bias electrode 100 and sense electrode B 120. The droplet pair making contact with bias electrode 100 and sense electrode B 120 may be considered a reference droplet pair, in that the expected behaviour with time of the current $I_{Ref}$ flowing through the reference droplet pair is expected to be solely influenced by "noise". As such, the current measured may be used to compensate for any influence of noise on measurements made between a sensing pair of droplets respectively in contact with bias electrode 100 and sense electrode A 110. Thus the current $I_{sense}$ flowing through the sensing droplet pair from which influence of noise has been diminished, may be considered to be a more true representation of the process of interest occurring within the sensing pair of droplets. Conveniently, the reference droplet pair may be arranged such that its properties are not expected to vary, such that the measured current $I_{Ref}$ is only expected to vary over time as a function of noise.

Guard electrode 130 is preferably provided to minimise effects of parasitic coupling between respective sense electrodes A 110 and sense electrodes B 120. As the relative density i.e. the total number of electrodes increases, with consequent reduction in the width and gap distance, between respective sense electrodes A 110 and sense electrodes B 120, there is likely to be a greater influence of parasitic capacitance on individual sense electrodes. That is, when two conductors are sufficiently close, and carrying different voltages, then charge coupling effects can occur between respective tracks. Guard electrode 130, which may either be connected to ground or to a DC circuit of electrode control electronics 3a, serves as a shield mitigating undesirable charging effects in either sense electrode A 110 or sense electrode B 120.

Figure 5:
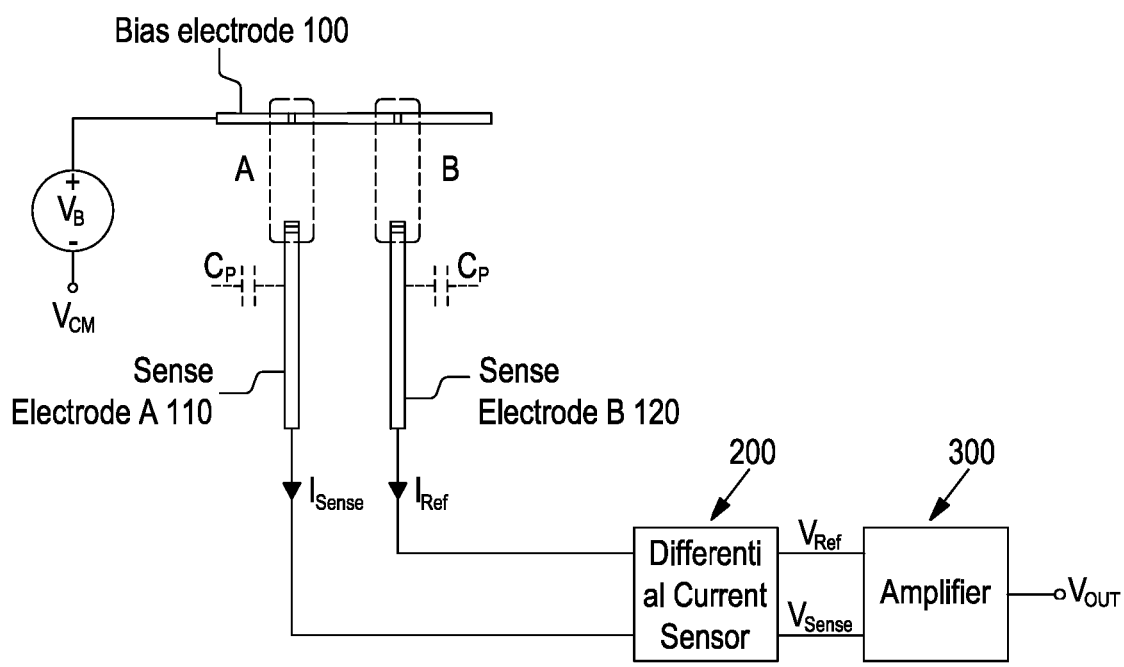
FIG. 5 represents a first embodiment of a sensor configuration with a differential circuit.

The electrode structure of FIG. 4a may also be used with a single droplet rather than a droplet pair, as shown in FIG. 5 for example. Again, the droplet making contact with the bias electrode 100 and sense electrode B 120 may be considered a reference droplet, in that the expected behaviour with time of the current $I_{Ref}$ flowing through the reference droplet is known to vary as a function of noise only, but not due to changes in droplet composition.

FIGS. 5 and 7a to 12 represent exemplary circuit configurations according to a series of embodiments of the invention that may be used to monitor a process in a fluid package (that is, within a single droplet) such as an electrochemical reaction within a droplet. In traditional measurement configurations it has been observed that electrical interference, such as EMI and other interferences, including parasitic capacitance, may adversely affect measurement of small currents in the range of pA, when a species of interest is transferred across a DIB.

In accordance with a first circuit embodiment, FIG. 5 depicts an arrangement where two droplets A and B (shown as elongated droplets for clarity in FIG. 5, though they don't necessarily need to have the shape shown in FIG. 5) are provided in contact with bias electrode 100 and in contact with sense electrode A 110 or sense electrode B 120 respectively. A bias voltage $V_B$ is applied between bias electrode 100 and sense electrode A 110 or sense electrode B 120 respectively, which results in currents $I_{Sense}$ and $I_{Ref}$. It is desired to measure the currents $I_{Sense}$ through droplet A, to provide information about an electrical property of droplet A such as its conductance, or of a process occurring within the droplet which yields an electrochemically detectable species, which may be oxidised (or reduced) at sense electrode 110, and thereby yield a measurable current when a potential is applied between bias electrode 100 and sense electrode A 110. If, for example, a reaction that is occurring in droplet A has the effect of changing the conductivity, measuring the currents $I_{Sense}$ over a period of time provides information on how the conductance of the droplet varies over time and hence provides information on the progress of the reaction responsible for the change in conductance. Both sense electrode A 110 and sense electrode B 120 may be susceptible to noise/cross talk via parasitic capacitance represented by capacitor Cp. Generally, the measurement value $I_{Sense}$ of Droplet A represents the parameter of interest and the measurement value $I_{Ref}$ of Droplet B represents a reference signal onto which interference or noise will couple in a similar manner as onto $I_{Sense}$. By differential sensing, eg sensing the difference between the two currents ($I_{Sense}$–$I_{Ref}$), the interference or noise may be subtracted from the measured $I_{Sense}$. The two values $I_{Sense}$ and $I_{Ref}$ are fed into a differential sensing circuit, which processes the respective values to yield an output $V_{OUT}$ that represents the difference between $I_{Sense}$ and $I_{Ref}$ and comprises a truer measurement of the signal of interest substantially free from effects of interference or noise. $V_B$ may be supplied as either a constant magnitude DC voltage or an AC voltage of constant peak-peak magnitude, depending on the intended purpose of the sensor circuit. When $V_B$ is provided as an AC voltage, the frequency with which values are sampled by the differential current sensor (DCS) 200 is lower, typically an order of magnitude lower, than the AC frequency. The DCS receives both $I_{Sense}$ and $I_{Ref}$ as current values and converts them to an output voltage value, that is substantially devoid of noise/crosstalk. When constructing the circuit, the skilled artisan will recognise the desirability of using conductive pathways that are essentially equivalent in terms of path length, width and conductivity, between paired circuits, such that parasitic capacitance and EMI affect each circuit similarly.

The present embodiment is an exemplary arrangement for determining the differential output $I_{Sense}-I_{Ref}$. The differential current sensor 200 may be of a standard arrangement comprising components as will be described in more details with reference to FIGS. 7*a-d*. As such, DCS 200 may be selected from any one of those depicted in FIG. 7 *a* to *d* (or functional equivalents thereof as will be apparent to the person skilled in the art). The DCS 200 processes the input signal in such a way that the noise is essentially cancelled out, thus improving the signal to noise ratio. An amplifier 300 receives the voltage output from the DCS, and further process the signal to yield a voltage of appropriate magnitude to be recorded by a suitable recorder (not shown). Amplifier 300 produces voltage $V_{OUT}$, which is transferred to sensing control electronics 3*d* (as depicted in FIG. 3*b*), which voltage data is used to prepare a profile of signal over time, which is representative of the process occurring within the droplet of interest.

Figure 6A:
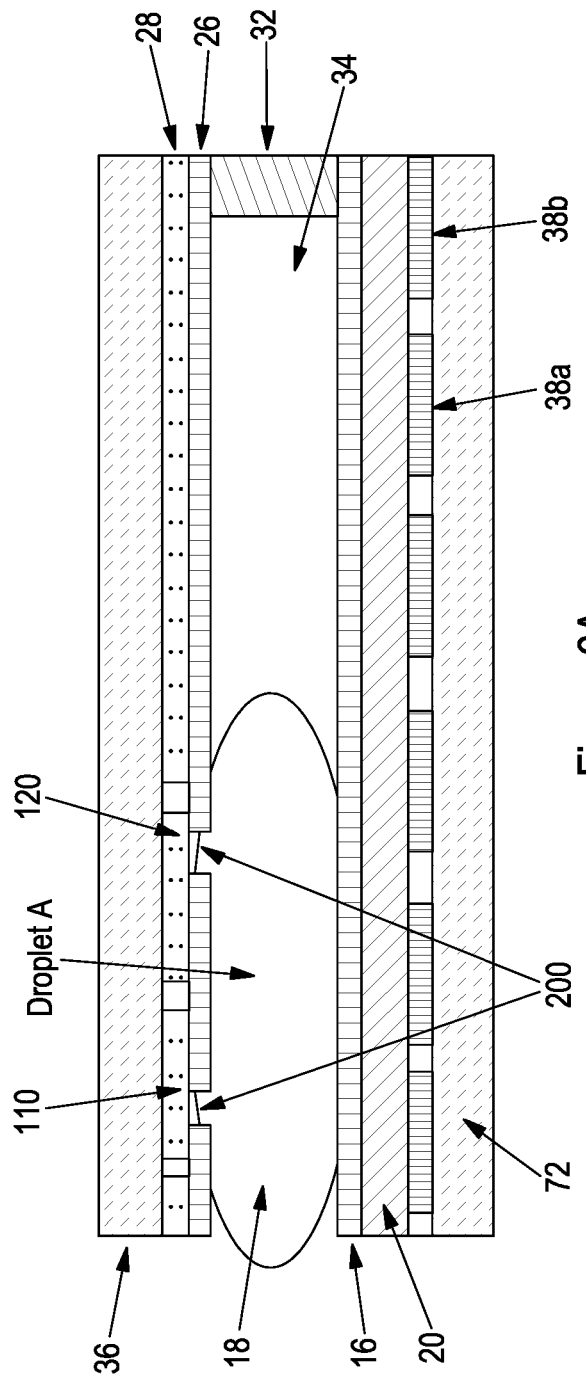
FIG. 6a represents a cross sectional view through an exemplary EWOD device depicting relationship between a single droplet within chamber and respective electrodes with a patterned hydrophobic coating.

FIGS. 6*a* and *b* represent cross sectional views through a single droplet as depicted in FIG. 5. FIG. 6*a* shows a single Droplet A positioned beneath sense electrode A 110 and sense electrode B 120; in which apertures are provided in hydrophobic coating 26, thereby forming pathways for direct contact between sense electrode A 110 and sense electrode B 120 and droplet A. In such a configuration, an electrochemical process within Droplet A may be monitored, for example, by applying a voltage between sense electrode A 110 and sense electrode B 120, and monitoring the resulting current that flows at one or the other electrode. In this embodiment, one of the sense electrodes acts as the bias electrode of other embodiments—rather than applying a voltage via the bias electrode 100 as in FIG. 5, one of the sense electrodes is used to apply a bias voltage to the droplet.

FIG. 6*b* depicts an alternate configuration to the cross sectional view of FIG. 6*a*, in which hydrophobic coating 26 is contiguous across the surface of sense electrode A 110 and sense electrode B 120, thus providing a barrier layer between Droplet A and the respective sense electrodes 110, 120. The effect of hydrophobic coating on the electrode surface means that Droplet A is electrically coupled by capacitive means to the respective sense electrodes 110, 120. Advantageously, maintaining a continuous hydrophobic coating avoids the need to pattern the layer in this area, thus making the device simpler to manufacture. Furthermore, the presence of hydrophobic coating 26 over sense electrodes 110, 120 is such that effects such as hydrolysis of the polar fluid may be minimised when DC voltages exceeding 1.23V are applied between bias electrode 100 and sense electrode A 110 or sense electrode B 120

When measuring current responses within EWOD devices, for example, where currents may typically be in the picoampere range, there is a risk of effects such as electromagnetic interference, coupled, for example, through parasitic capacitance onto the conductive pathways that connect sense electrode A 110 and sense electrode B 120 to a microprocessor configured to determine a measurement value within the electrode control electronics 3*a* (as depicted in FIG. 3*a*; and as discussed with reference to FIGS. 5 and 7*a* to 12). Aspects of the present invention seeks to mitigate such interferences through use of selective sensor circuit configurations based on differential current sensors, which incorporate features designed to minimise the influence of "noise" and therefore achieve an increased signal-to-noise ratio, improving the likelihood of success of very sensitive measurements.

Figure 7A:
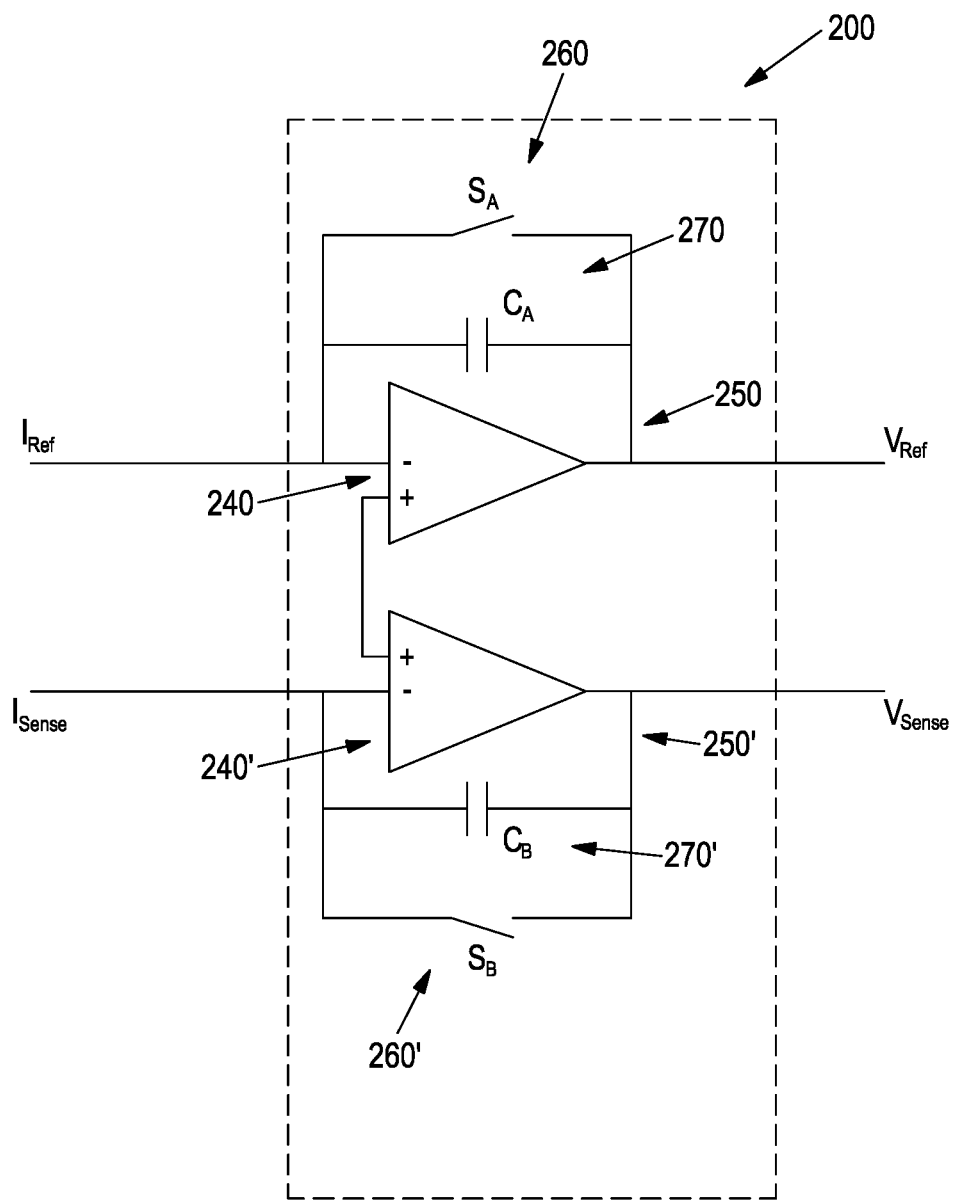
FIG. 7a represents a first differential circuit configuration.

FIG. 7*a* depicts a first circuit configuration of a DCS 200. The circuit comprises a pair of operational amplifiers (op-amps) configured in single ended operational mode, which comprise op-amps 240, 240', configured to receive current inputs $I_{Sense}$ and $I_{Ref}$ respectively produced from Droplets A and B; with each op-amp 240, 240' outputting voltages $V_{Sense}$ and $V_{Ref}$, which are fed into amplifier 300, which yields a single output $V_{OUT}$ that is transferred to sensing control electronics 3*d*.

Figure 7B:
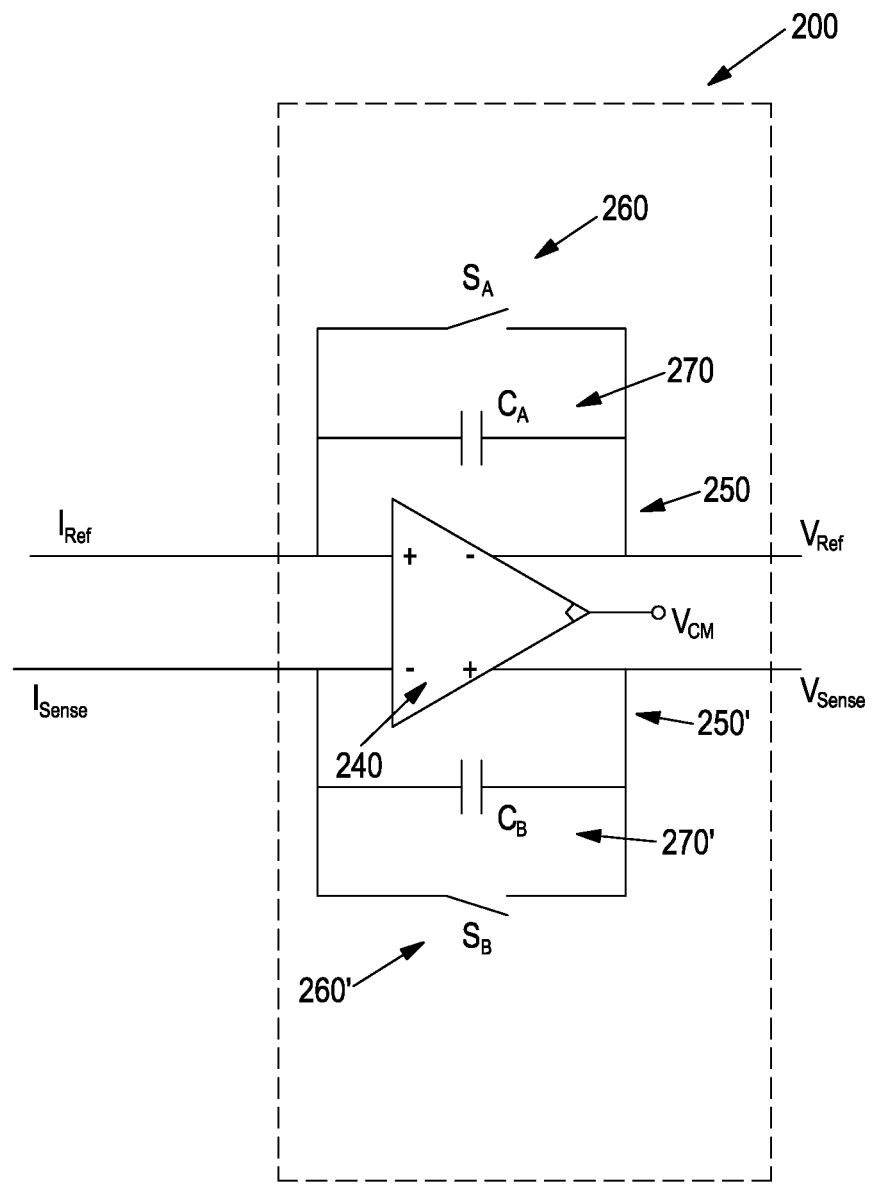
FIG. 7b represents a second differential circuit configuration.

FIG. 7*b* depicts a second circuit configuration of a DCS 200. The circuit comprises an operational amplifier 240 configured in differential operational mode, switches 260, 260', and capacitors 270, 270'. Op-amp 240 receives current inputs $I_{Sense}$ and $I_{Ref}$, which are referenced against the common mode voltage VCM. The DCS 200 samples signals from $I_{Sense}$ and $I_{Ref}$ and processes the signals to yield a single output $V_{OUT}$. The feedback loops 250, 250' include switches 260, 260' which when closed reset the charge stored in the capacitor 270, 270', which results in the output $V_{OUT}$ also being reset. The sampling rate of switches 260, 260' determines the frequency at which the input signal is sampled to create an output $V_{OUT}$.

Figure 7C:
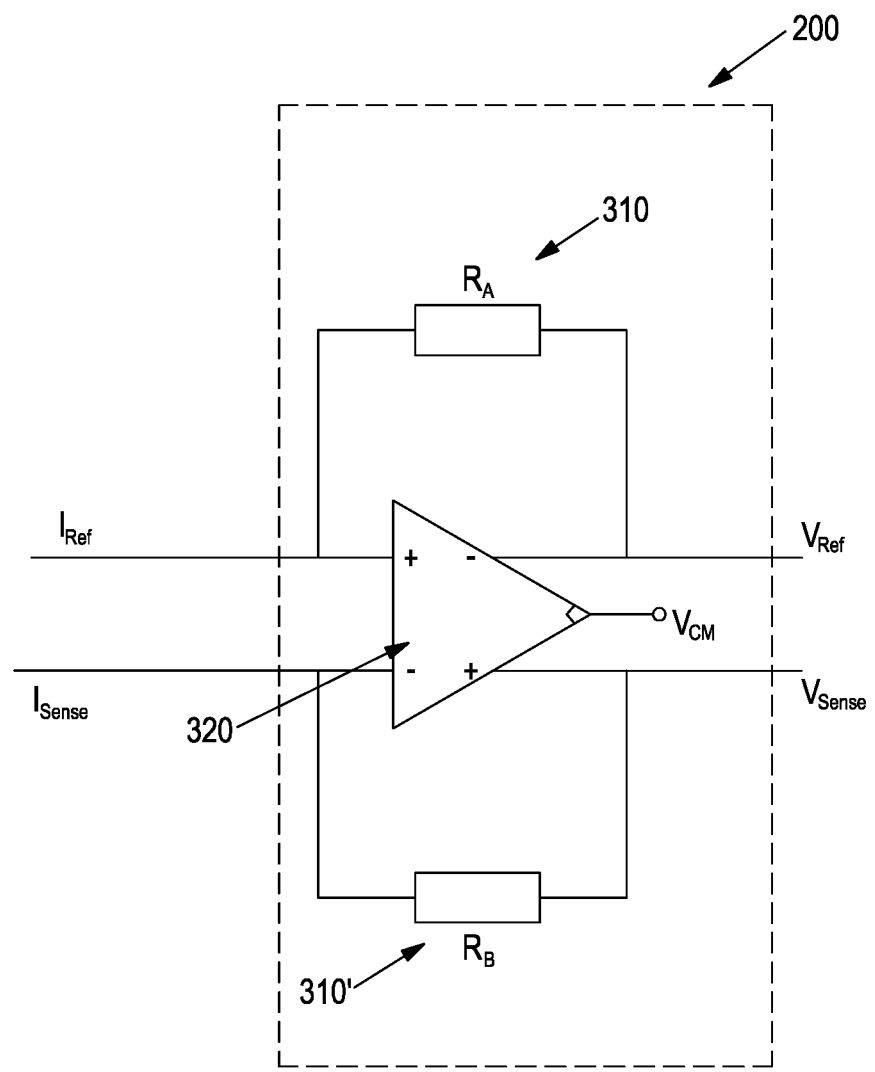
FIG. 7c represents a third differential circuit configuration.

FIG. 7*c*, represents a different exemplary circuit arrangement employed to determine the differential output signal $I_{Sense}-I_{Ref}$. The DCS of FIG. 6*c* is configured with a transimpedance amplifier (TIA) which comprises a differential amplifier 320, and resistors 310, 310'. In this configuration, when $V_B$ is DC the circuit will measure the difference in resistance of the sensing and reference droplets; and when $V_B$ is AC, the circuit will measure the real and imaginary droplet impedance, by measuring relative amplitude and phase change of AC currents $I_{Sense}$ and $I_{Ref}$. The DCS produces $V_{Sense}$ and $V_{Ref}$, which are further processed to yield $V_{OUT}$, which represents the desired signal due to the process of interest, substantially free from interference, similar to the circuits of FIGS. 7*a* and 7*b*.

Figure 7D:
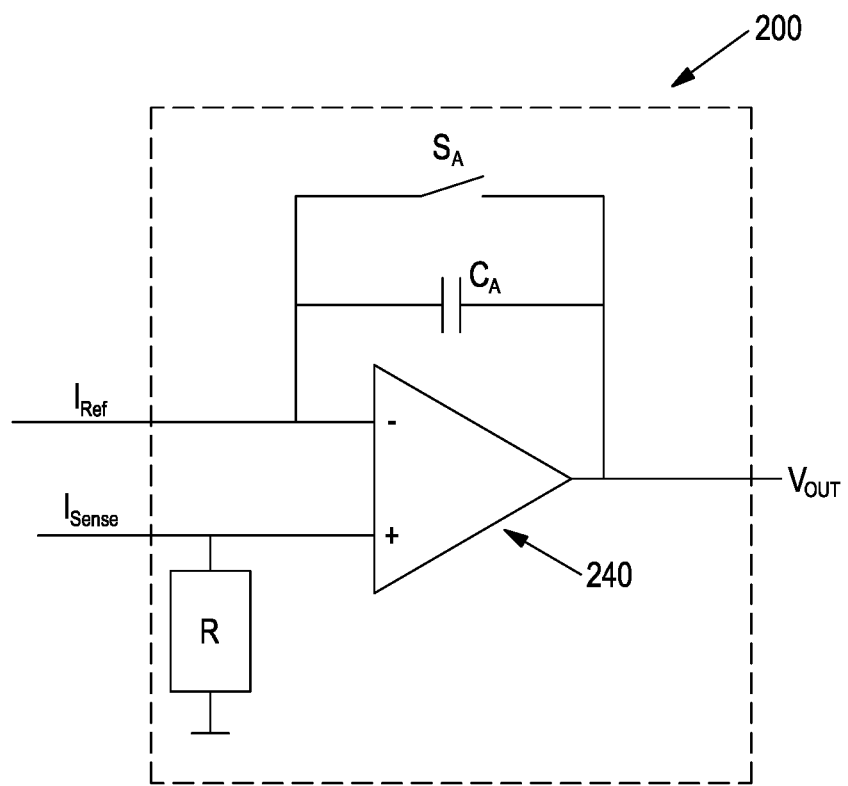
FIG. 7d represents a fourth differential circuit configuration.

FIG. 7*d* represents yet another exemplary circuit arrangement employed to determine the differential output signal $I_{Sense}-I_{Ref}$. In the configurations of FIG. 6*d*, $I_{Sense}$ is connected via a resistor R to ground, such that the first stage of the sensing circuit is configured as a single ended integrator. The circuit of FIG. 7*d* is expected to yield similar performance improvements as the circuit of FIG. 7*b*, however it may be realised with a standard single-ended integrator arrangement and as such may be more conveniently manufactured using commercially available components.

Figure 8:
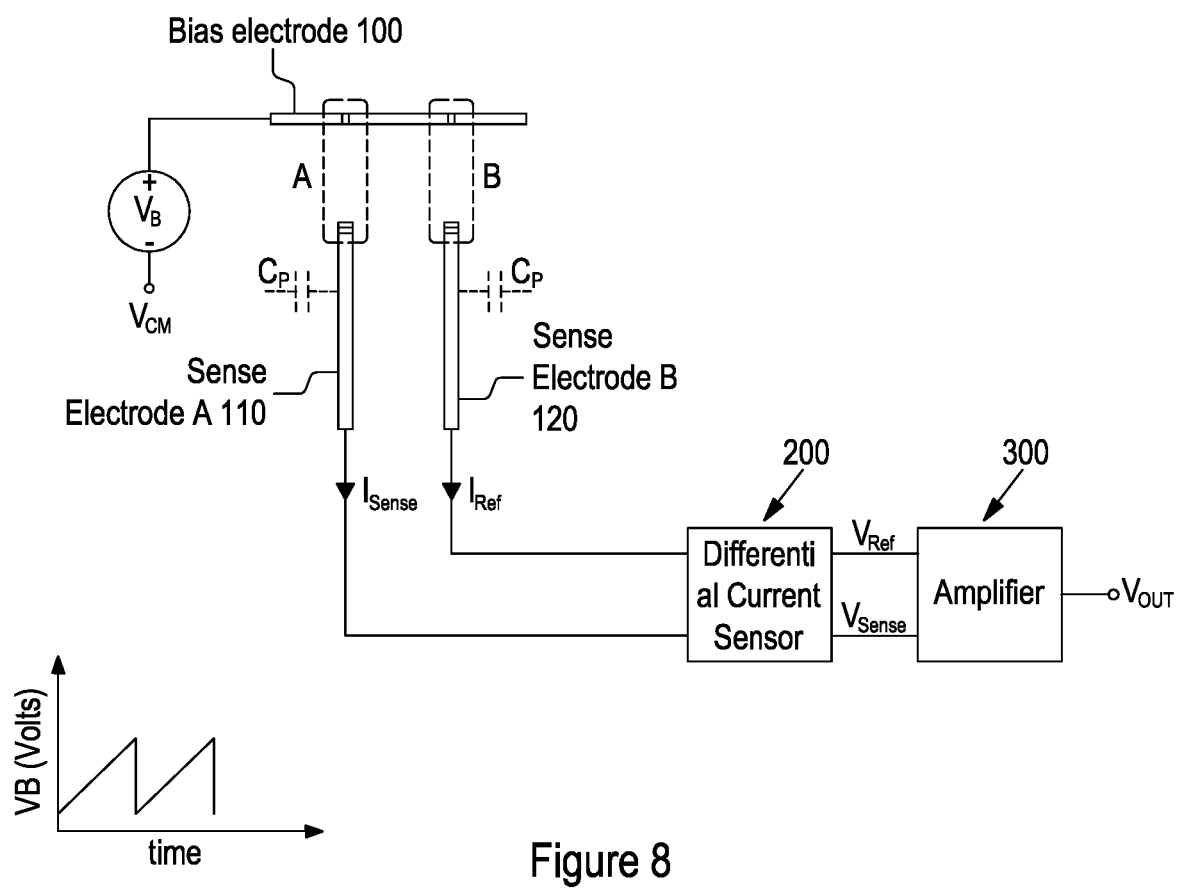
FIG. 8 represents a second embodiment of a sensor configuration with a differential circuit.

FIG. 8 is similar to FIG. 5, however in this embodiment $V_B$ is supplied as a saw tooth wave, which has a linearly increasing value, that sweeps from a minimum to a maximum value and then drops back to the starting value and repeats (as shown in the inset to FIG. 8). DCS 200 may be configured using any of the circuits depicted in FIGS. 7a to d. During the process of changing the voltage value, DCS 200 may be used to measure different characteristics of the droplet when exposed to increasing voltage. When $V_B$ is supplied as an AC voltage, either the peak-to-peak amplitude or the frequency may be modulated with measurement values $V_{OUT}$ being recorded at different values of $V_B$.

FIG. 9 represents a further modification of the circuit described in FIG. 5, in which a second bias electrode 100' is included. One droplet makes contact with one bias electrode 100 and sense electrode A 110, and the other droplet makes contact with the second bias electrode 100' and sense electrode B 120, such that Droplet A and Droplet B may be exposed to different applied bias voltages, $V_{B1}$ and $V_{B2}$ respectively. At the start of a test procedure before a reaction process within Droplet A has been initiated, $V_{B1}$ and $V_{B2}$ may be modulated such that the initial values for $I_{Sense}$ and $I_{Ref}$ are essentially of equal value, thereby compensating for possible variation in the size or volume of the two droplets; or for other variances in the respective circuits with which each droplet is a part. Any measurements made of a reaction processes of interest occurring within Droplet A may therefore yield further refinement to the value of output $V_{OUT}$, since further variance due to differences caused by variation of the size, volume or composition, in addition to the effects of parasitic capacitance or electromagnetic interference that are compensated for by Droplet B, may be taken into consideration when generating $V_{OUT}$.

The embodiment of FIG. 9 (which comprises two independently addressable bias electrodes) may be applied with any suitable circuit arrangement employed to determine the differential output signal $I_{Sense}$–$I_{Ref}$, in which the DCS may be selected from one of those described with reference to FIGS. 7a to d.

Figure 10:
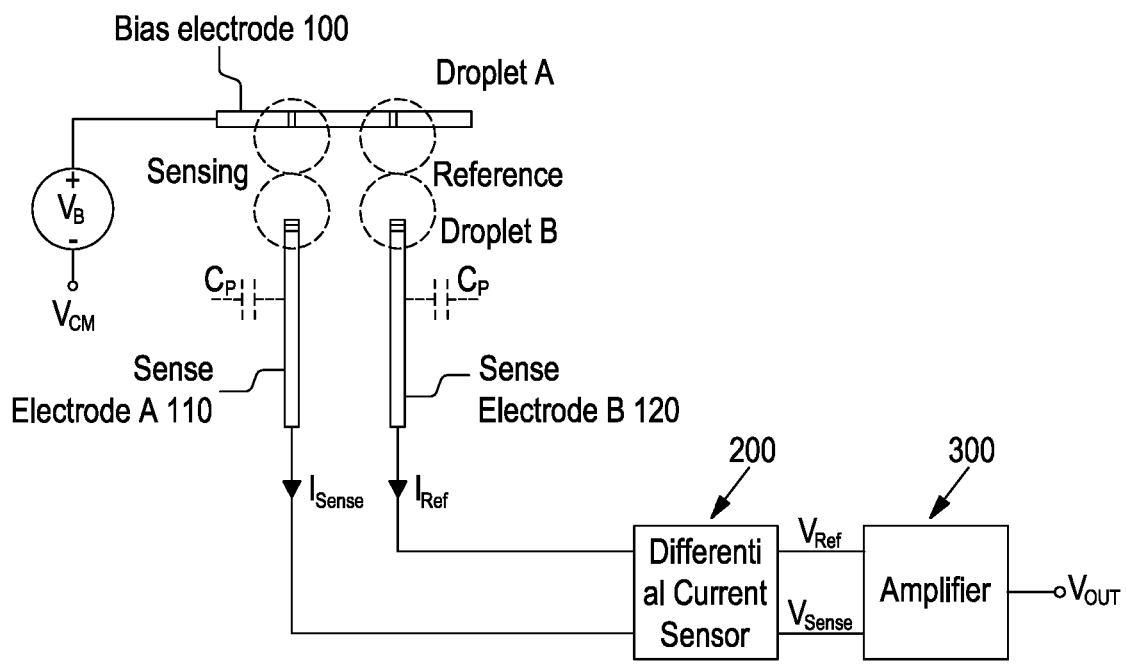
FIG. 10 represents an fourth embodiment of a sensor configuration with a differential circuit.
Figure 11:
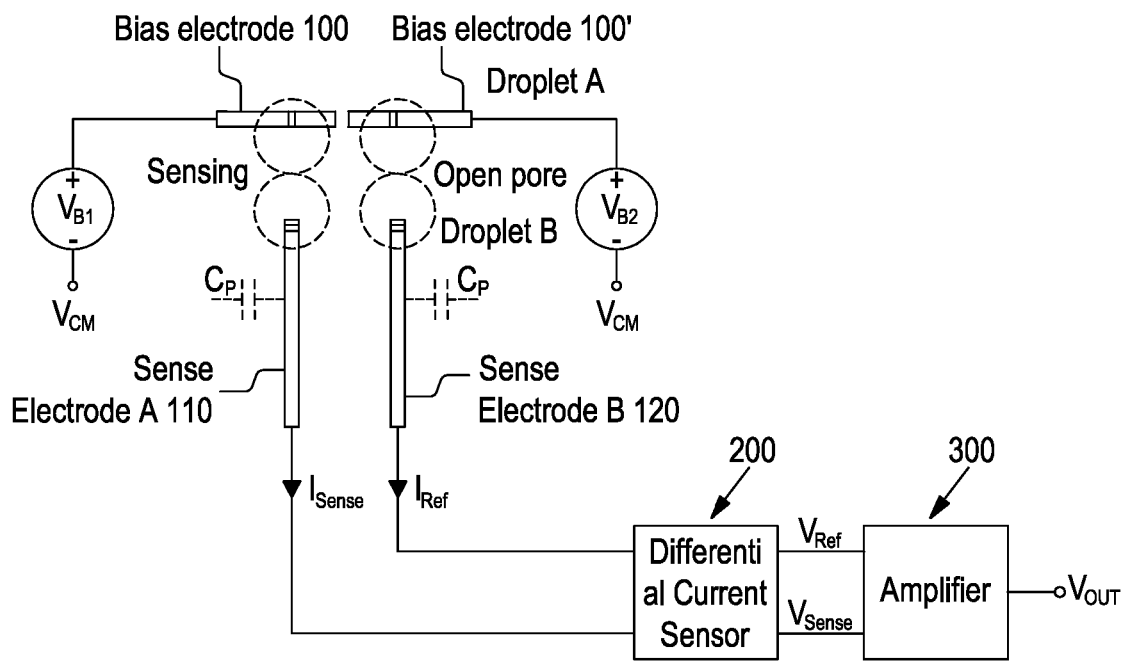
FIG. 11 represents a fifth embodiment of a sensor configuration with a differential circuit.
Figure 12:
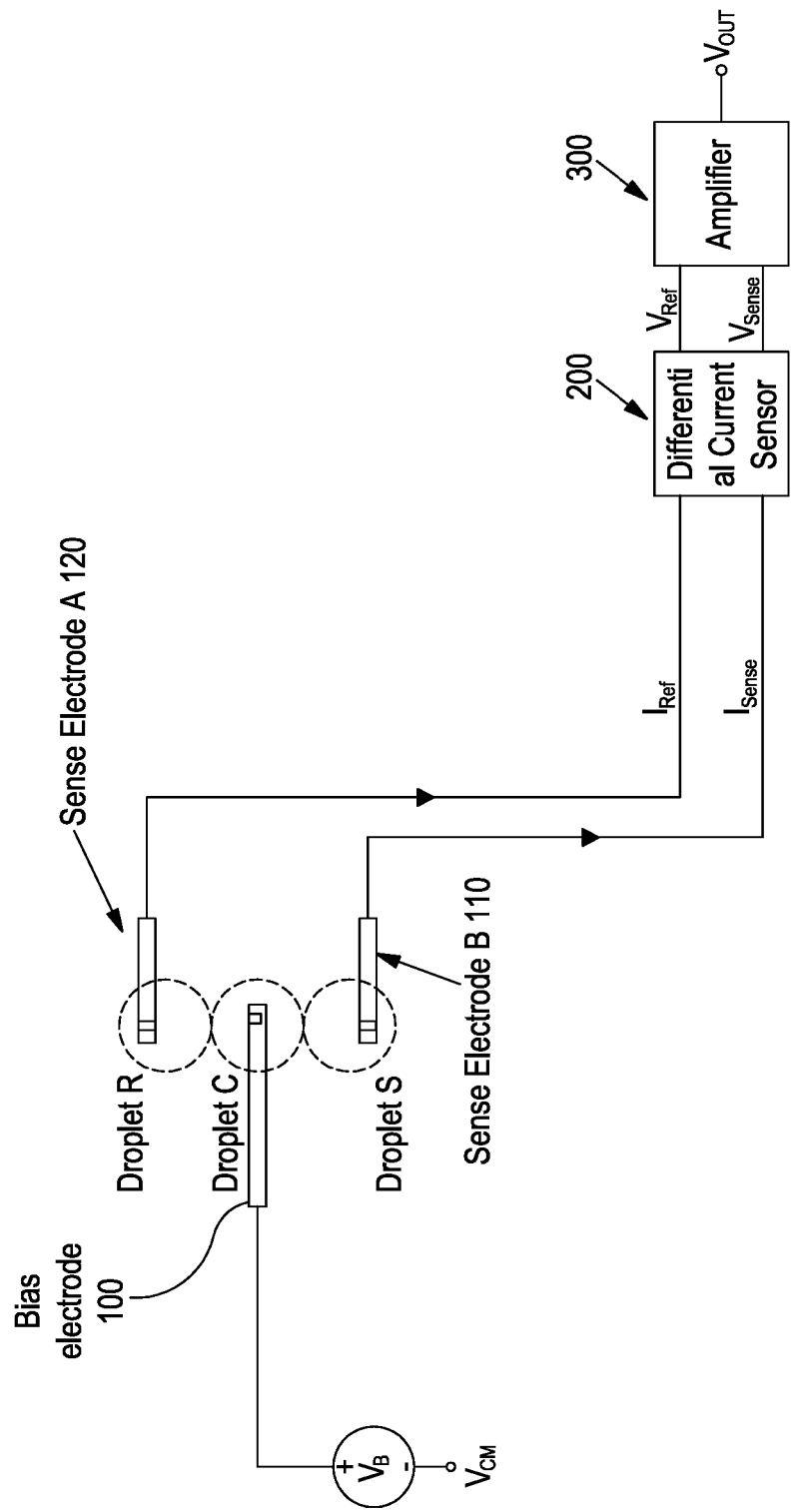
FIG. 12 represents a sixth embodiment of a sensor configuration with a differential circuit.

FIGS. 10 to 12 represent exemplary circuit configurations according to a series of embodiments of the invention that may be used to monitor a process in a pair of droplets forming a droplet interface bilayer, such as of solute transfer between droplets by a process of diffusion or osmosis, or due to an electrochemical reaction within a droplet.

FIG. 10 corresponds to the circuit of FIG. 5, however unlike FIG. 5, two pairs of droplets are provided in place of the single elongate droplets. In one embodiment, the sensing pair of droplets may differ from the reference pair, in that the sensing pair may include a solute of interest, that is expected to transfer from one droplet to the other by a process of diffusion or osmosis across the interface; or which solute may participate in a reaction that yields an electrochemically measurable product. Signals arising from the reference pair may be subtracted from signals from the sensing pair to yield a signal indicative of the reaction or process of interest occurring within the sensing pair, which is substantially free from the effects of noise as described herein above. The bias voltage $V_B$ is typically a DC voltage, but could in principle be an AC voltage.

Thus, as described with reference to FIG. 5, the DCS 200 receives $I_{Sense}$ and $I_{Ref}$ and produces a value $V_{OUT}$, which is a more accurate representation of the reaction or process of interest that occurs within or between Droplet A and Droplet B of the sensing pair.

Any variation in current that occurs due to coupling via parasitic capacitance or electromagnetic interference, which may otherwise adversely change the current value that is measured when a reaction occurs within a droplet A or B or solute species diffuses or moves by osmosis across a DIB may thus be substantially eliminated through the use of the reference pair of droplets, which would be expected to experience essentially the same parasitic capacitance or electromagnetic interference as the sensing pair of droplets, within acceptable tolerance limits.

FIG. 11 corresponds to FIG. 10, but with the presence of two pairs of droplets, respectively having a DIB therebetween, in which respective Droplet A's are in contact with distinct bias electrodes 100, 100'. As described with reference to FIG. 9, the presence of two bias electrodes 100, 100' allows for modulation of $V_{B1}$ and $V_{B2}$ to be done to compensate for any initial imbalance in $I_{Sense}$ and $I_{Ref}$ respectively that might occur prior to commencing a measurement process. As such, making ongoing minor adjustments may further enhance the differences between the measured baseline signal and a measured signal of interest that arises from the sensing pair of droplets, leading to an improved signal to noise ratio. The processing of $I_{Sense}$ and $I_{Ref}$ through DCS 200 may further enhance the difference between signal and noise, thus improving the ability to discriminate low level signals, which may otherwise be lost in system noise.

FIG. 13a-b illustrate a cross-sectional view of a droplet interface bilayer in a microfluidic device such as an AM-EWOD device. Initially, with reference to FIG. 13a, two fluid droplets, Droplet A, and Droplet B are provided. Typically, Droplet A and Droplet B are droplets of polar fluid and are disposed in a non-polar filler fluid 34 (such as oil) disposed in the fluid space of the EWOD device, as shown generally in FIG. 1.

As used herein, specifying that a first droplet and a second droplet "may be manipulated so as to be brought together by appropriate actuation of the array element electrodes of the EWOD device" covers a case where array element electrodes of the EWOD device are actuated to hold the first droplet stationary and move the second droplet into contact with the first droplet, a case where array element electrodes of the EWOD device are actuated to hold the second droplet stationary and move the first droplet into contact with the second droplet, and a case where array element electrodes of the EWOD device are actuated to move the first droplet and to move the second droplet so that the first and second droplets to make contact with one another.

Droplet A contains fluid (e.g. liquid) of a first composition that includes at least a first solute species in a first solvent. In the case of polar fluid droplets, the first solvent is typically water although it could be another polar solvent such as methanol, for example. The second droplet, droplet B, contains fluid (e.g. liquid) of a second composition that may be the same or different to the composition of the fluid of droplet A. The fluid in droplet B may contain one or more solute species in a solvent, and the fluid of droplet B may have the same or a higher overall solute concentration than the fluid of droplet A. As used herein, a "solute" is a substance that is dissolved in another substance, known as a "solvent", to form a mixture known as a "solution".

The solvent in droplet B will generally be the same solvent as the solvent in droplet A, although the invention is in principle not limited to this. As a result, the solution in droplet B may have a higher osmotic pressure than droplet A. (In a case where the solvent (second solvent) in droplet B is not the same as the solvent (first solvent) in droplet A, it is possible that the DIB between droplet A and droplet B will be permeable to both the first solvent and the second solvent, so that the two resultant droplets include both the first solvent and the second solvent—if a droplet having methanol as its solvent and a droplet having water as its solvent were to form a droplet interface bilayer, as an example, one would expect that the DIB would be permeable to both water and methanol. After formation of the DIB, each droplet would therefore be likely to contain a mixture of the first and second solvents, since these may transfer across the DIB by diffusion or osmosis. The solute composition of the droplets will depend on the permeability of the DIB to the solute(s) present in the initial droplets.)

According to the embodiments of FIG. 13a-b, Droplet A and Droplet B are manipulated to come together in such a way that they do not merge into a single droplet, but instead form a droplet interface bilayer (DIB) on contact between the respective meniscus of each droplet. Each droplet is surrounded by a monolayer of amphiphilic molecules, such as a lipid monolayer. Amphiphilic molecules used to make up the DIB may be introduced from either the droplet (using the 'lipid in' method) or the filler fluid (using the 'lipid-out' method). The "lipid in" and "lipid out" methods are well known techniques for forming DIBs, and are described in, for example, "Sensors and Actuators B: Chemical", 2013, 185 pp 530 to 542. A wide range of amphiphilic molecules can be used to form lipid monolayers; including lipids, surfactants and detergents examples of polymer surfactants are diblock and triblock copolymers (but the invention is not limited to these).

When the two droplets are manipulated, for example by electrowetting in an EWOD device, so as to come together, the amphiphilic molecules of one droplet interact with the amphiphilic molecules of another droplet so that the amphiphilic monolayers of the two droplets form a droplet interface bilayer 10 as shown in FIG. 13a. Formation of a droplet interface bilayer is a reversible process, and the two droplets may subsequently be manipulated to separate from one another—provided that they have not merged into a single droplet.

The droplet interface bilayer 10 forms a semi-permeable membrane, so that small molecules are able to pass from one droplet, through the droplet interface bilayer, into the second droplet whereas larger molecules may not pass through the droplet interface bilayer 10. Provided that the molecules of the polar solvent in droplet A are small—for example if the solvent is water or methanol—solvent molecules are able to pass through the droplet interface bilayer. The difference in the osmotic pressure of the solutions in droplet A and droplet B results in the movement of solvent molecules from Droplet A across the droplet interface bilayer 10 into Droplet B.

The solute species in Droplet A and Droplet B are typically large molecules, charged molecules or ions, which may pass through the droplet interface bilayer, albeit they may pass through the DIB but at a much lower rate than the rate at which solvent molecules can pass through the DIB. For example, it is likely that a solute species comprising ions or highly charged molecules would not be able to pass through a DIB, whereas dye molecules that are neutral or have a small charge would probably pass through a DIB, but at a low rate. The transport properties of a DIB depend inter alia on the structure of the DIB, and which surfactants have been used in its formation.

The rate at which solvent passes from Droplet A to Droplet B across the droplet interface bilayer will depend inter alia on the difference in osmotic pressure between the fluid in Droplet A and the fluid in Droplet B when the DIB forms between Droplet A and Droplet B. The relative osmotic pressure of droplets A and B will depend very much on the specific application According to the embodiment of FIG. 13a, Droplet A and Droplet B are arranged to form a DIB within an EWOD device that has a single reference electrode 28 and a plurality of array element electrodes 38A and 38B. Hydrophobic coating 26 is uniformly present over reference electrode 28. Therefore, Droplets A and B are electrically coupled by capacitive means to reference electrode 28. In such a configuration, monitoring processes occurring within either droplet A or B; or monitoring the transfer of solute or solvent from Droplet A to Droplet B based on changes in an electrical characteristic, may not be feasible, per se (as described herein above with reference to the differential current sensor, for example). However, changes in the respective size of either droplet may be monitored using either capacitance or impedance feedback from the integrated EWOD sensor (as for example described in U.S. Pat. No. 10,078,986, the contents of which are incorporated herein by reference). Or changes in the colour or fluorescence of a particular droplet may be determined as described in for example Applicant's pending U.S. application Ser. No. 16/014,006 (which is incorporated herein by reference). In this embodiment, one of the sense electrodes acts as the bias electrode of other embodiments—rather than applying a voltage via the bias electrode 100 as in FIG. 10 or 11, one of the sense electrodes is used to apply a bias voltage to the droplet pair.

FIG. 13b is similar to the view of FIG. 13a, with the exception that independently addressable electrodes have been patterned on the top substrate 36. One electrode pair, constituted by sense electrode A 110 and sense electrode B 120 are depicted, although it will be appreciated additional pairs of electrodes may be provided on top substrate 36 as required. In this embodiment, one of the sense electrodes acts as the bias electrode of other embodiments—rather than applying a voltage via the bias electrode 100 as in FIG. 10 or 11, one of the sense electrodes is used to apply a bias voltage to the droplet pair.

In addition to the definition of independently addressable electrodes 110, 120, apertures 200 are also formed in hydrophobic layer 26. Apertures 200 are dimensioned such that, to a droplet positioned thereunder, the apertures are insignificant in respect of general electrowetting effects (i.e. do not significantly impede droplet motion); however, apertures 200 are of sufficient dimension [from about 1 um to about 100 um] to permit direct connection to be made with either Droplet A or Droplet B and sense electrode A 110 or sense electrode B 120 respectively, when a droplet is positioned directly beneath an aperture 200. A typical diameter of aperture that does not significantly impede droplet motion would be around <50% of the diameter of a droplet being manipulated over it. Thus, for a device intended to operate with small droplets (d=100 um), the diameter of an aperture 200 should be 50 um or lower, while for a device intended to operate with larger droplets (d=1000 um) the diameter of an aperture 200 could be 500 um or lower.

Sense electrode A 110 and sense electrode B 120 may be operated independently of the electrowetting electrodes 38A, 38B, although if required they may be configured to function as one with reference electrode 28 (as described herein above). When a voltage is applied between sense electrode A 110 and sense electrode B 120, the resulting current that flows across DIB 10 may be monitored. Such current may for example be due to the movement of molecules of interest 18 from Droplet A into Droplet B by a process of diffusion, osmosis or electro-osmosis.

In embodiments in which a bias voltage is applied to a droplet, or to a droplet pair, using a bias electrode 100 rather than a sense electrode, an aperture may again be formed in the hydrophobic layer to permit direct contact to be made between the bias electrode and the droplet or a droplet of the droplet pair. Again, such aperture is preferably dimensioned such that, to a droplet positioned thereunder, the aperture is insignificant in respect of general electrowetting effects (i.e. do not significantly impede droplet motion), but are of sufficient dimension [from about 1 um to about 100 um] to permit direct contact to be made with a droplet is positioned directly beneath the aperture.

Exemplary application of the improved measurement circuits of the invention to a method of measuring the properties of one or more droplets, will be described herein below.

Biochemical Analyses

When a biochemical or chemical workflow is being performed through the manipulation of aqueous droplets in an EWOD device, it is often desired to measure properties of the fluid composition of a droplet in order to determine whether or to what extent a reaction has occurred. Examples of droplet measurement/detection techniques include optical measurements such as absorption or fluorescence, electrochemical measurements, such as determination of the pH, $pO_2$, or $pCO_2$ of the fluid; determination of the redox potential of a component of the fluid; measurement of the electrical conductivity of the droplet (which provides a measure of the ionic content of the droplet), or measurement of the speed of movement induced in a droplet for a given actuation voltage. These and other electrical detection techniques may be made more reliable if the determination of the fluid composition of the droplet is determined using an improved circuit of the invention before the measurement is made. For example, the measurement of currents produced due to electrochemical oxidation of a solute within the fluid, in which a species of interest may be oxidised at the surface of sense electrode A 110. For example, the oxidation of glucose catalysed by glucose oxidase or glucose dehydrogenase may be monitored due to the ultimate oxidation of a reduced mediator species at the surface of sense electrode A 110. Examples of such mediator species include ferrocene, ferricyanide, hydrogen peroxide, as are well known in the art, for example as described in Chen et al., RSC Advances, 2013, 3, 4473.

In another process, a change in droplet composition may be monitored during the process of transfer of a molecule of interest or a solute species from Droplet A to Droplet B. For example, the process may be to determine whether, and if so to what extent, the transfer of the molecule of interest or solute species has occurred. Examples of processes that might benefit from monitoring the transport of a species across the droplet interface bilayer include, without limitation:

- change of the pH of one or both droplets may be measured by a pH sensor provided in/on the EWOD device;
- change in the electrical conductivity of one or more droplets may be measured, for example using the array element electrodes 38A, 38B and the common electrode 28, or using sense electrode A 110 and sense electrode B 120;
- change in one or more optical properties of the droplet may be measured, such as absorption or fluorescence;
- change in the viscosity of one or both droplets may be measured, to detect changes arising from the transfer of the solute species from one droplet to another; such changes may be determined as a change in impedance of a droplet or change in the ability to move the droplet by EWOD;
- sensing changes in the droplet sizes arising during the process of transfer of the solute species from Droplet A to Droplet B. Any change in droplet size will depend on the permeability of the lipid bilayer and the osmotic pressures of the solutions of the droplets.

The invention claimed is:

1. An electro-wetting on dielectric (EWOD) device, comprising:
   first and second substrates defining a fluid chamber therebetween; a plurality of electro-wetting electrodes on the first substrate;
   at least one first electrode and at least two second electrodes on the second substrate;
   and
   a current sensor for sensing a difference between (1) a first current flowing between the first electrode and one of the second electrodes via a first fluid package in the fluid chamber of the EWOD device and (2) a second current flowing between the first electrode and another of the second electrodes via a second fluid package in the fluid chamber of the EWOD device.

2. A device as claimed in claim 1, wherein the current sensor is a differential current sensor receiving as inputs the first current and the second current.

3. A device as claimed in claim 1 and further comprising at least one third electrode on the second substrate.

4. A device as claimed in claim 1 and comprising a fluid droplet in electrical contact with the first electrode and the one of the second electrodes, the fluid droplet constituting the first fluid package.

5. A device as claimed in claim 3 and comprising a fluid droplet in electrical contact with the first electrode and the one of the second electrodes, the fluid droplet constituting the first fluid package, and wherein the droplet is in electrical contact with the third electrode.

6. A device as claimed in claim 1 and comprising first and second fluid droplets with a droplet interface bilayer therebetween, the first droplet being in electrical contact with the first electrode and the second droplet being in electrical contact with one second electrode, the first and second fluid droplets constituting the first fluid package.

7. A device as claimed in claim 1, the first electrode extends in a first direction and the one of the second electrodes and the another of the second electrodes extend substantially parallel to one another, and extend in a second direction that is crossed with the first direction.

8. A device as claimed in claim 7 wherein the first electrode and the second electrodes are defined in a common conductive layer.

9. A device as claimed in claim 7 wherein a guard electrode is provided between the first electrode and the second electrodes.

10. A device as claimed in claim 9 wherein the first electrode and the second electrodes are defined in a common conductive layer, and the guard electrode is defined in the common conductive layer.

11. A device as claimed in claim 1, wherein a plurality of first electrodes are provided on the second substrate, the first electrodes extending substantially parallel to one another in a first direction;
   and wherein the second electrodes extend substantially parallel to one another, and extend in a second direction crossed with the first direction.

12. A device as claimed in claim 11 wherein the first electrodes are defined in a first conductive layer and the second electrodes are defined in a second conductive layer.

13. A device as claimed in claim 1 wherein a hydrophobic coating is provided over the electrodes on the second substrate, and wherein apertures are provided in the hydrophobic coating to define regions of electrical contact between the fluid packages and the electrodes.

14. A device as claimed in claim 13, and comprising a fluid droplet, wherein the diameter of an aperture in the hydrophobic coating is selected to be less than 50% of the diameter of the fluid droplet so as not to disrupt the macroscale hydrophobic surface property of the hydrophobic coating.

15. A method of sensing electrical properties of a fluid package in an electro-wetting on dielectric (EWOD) device, the EWOD device having first and second substrates defining a fluid chamber therebetween, a plurality of electro-wetting electrodes on the first substrate, and at least one bias electrode and at least two sensing electrodes on the second substrate, the method comprising:
  applying a first bias voltage to a first bias electrode and applying a second bias voltage to a second bias electrode;
  sensing a first current flowing between the first bias electrode and one of the sensing electrodes via a first fluid package electrically coupled to the first bias electrode and the one of the sensing electrodes; and
  sensing a second current flowing between the second bias electrode and another of the sensing electrodes via a second fluid package electrically coupled to the second bias electrode and the another of the sensing electrodes.

16. A method as claimed in claim 15 wherein the first fluid package comprises at least one reaction constituent;
  wherein the second fluid package is a reference fluid package;
  and wherein the method further comprises monitoring the progress of a reaction in the first fluid package by comparing variation with time of electrical properties of the first fluid package with variation with time of electrical properties of the second fluid package.

17. A method as claimed in claim 15 wherein the first fluid package is a fluid droplet and the second fluid package is a second fluid droplet.

18. A method as claimed in claim 15 wherein the first fluid package comprises first and second fluid droplets having a first droplet interface bilayer therebetween, and the second fluid package comprises third and fourth fluid droplets having a second droplet interface bilayer therebetween, the first droplet electrically coupled to the first bias electrode, the second droplet electrically coupled to the one of the sensing electrodes, the third droplet electrically coupled to the second bias electrode, and the fourth droplet electrically coupled to the another of the sensing electrodes.

19. A method as claimed in claim 15 wherein the first bias electrode is electrically continuous with the second bias electrode to form a common bias electrode, and wherein applying the first bias voltage to the first bias electrode and applying the second bias voltage to the second bias electrode comprises applying a common bias voltage to the common bias electrode.

20. A method as claimed in claim 15 and further comprising, before applying the first bias voltage to the first bias electrode and applying the second bias voltage to the second bias electrode:
  selectively actuating the electro-wetting electrodes to move a first fluid package in the fluid chamber of the EWOD device to be electrically coupled to a first bias electrode and one of the sensing electrodes; and
  selectively actuating the electro-wetting electrodes to move a second fluid package in the fluid chamber of the EWOD device to be adjacent a second bias electrode and another of the sensing electrodes.

* * * * *